US 6,599,370 B2

(12) United States Patent
Skee

(10) Patent No.: US 6,599,370 B2
(45) Date of Patent: *Jul. 29, 2003

(54) STABILIZED ALKALINE COMPOSITIONS FOR CLEANING MICROELECTRONIC SUBSTRATES

(75) Inventor: David C. Skee, Bethlehem, PA (US)

(73) Assignee: Mallinckrodt Inc., St. Louis, MO (US)

( * ) Notice: Subject to any disclaimer, the term of this patent is extended or adjusted under 35 U.S.C. 154(b) by 141 days.

This patent is subject to a terminal disclaimer.

(21) Appl. No.: 09/859,142

(22) Filed: May 16, 2001

(65) Prior Publication Data

US 2002/0077259 A1 Jun. 20, 2002

Related U.S. Application Data

(63) Continuation-in-part of application No. 09/688,559, filed on Oct. 16, 2000.

(51) Int. Cl.[7] .............................................. C23G 1/02
(52) U.S. Cl. ................... 134/3; 134/2; 134/10; 134/34; 134/902; 510/176; 510/401; 252/79.5; 438/906
(58) Field of Search ..................... 510/176, 401; 134/2, 3, 10, 34, 902; 252/79.5; 438/906

(56) References Cited

U.S. PATENT DOCUMENTS

| 4,443,295 A | | 4/1984 | Radigan et al. | |
|---|---|---|---|---|
| 5,139,607 A | * | 8/1992 | Ward et al. | 216/83 |
| 5,290,361 A | * | 3/1994 | Hayashida et al. | 134/2 |
| 5,466,389 A | * | 11/1995 | Ilardi et al. | 510/175 |
| 5,753,601 A | * | 5/1998 | Ward et al. | 510/176 |
| 5,795,702 A | * | 8/1998 | Tanabe et al. | 430/331 |
| 5,817,610 A | * | 10/1998 | Honda et al. | 510/176 |
| 6,020,292 A | * | 2/2000 | Honda et al. | 510/175 |
| 6,117,783 A | * | 9/2000 | Small et al. | 438/693 |
| 6,121,127 A | | 9/2000 | Lee | |
| 6,130,195 A | | 10/2000 | Doyel et al. | |

OTHER PUBLICATIONS

Abstract of JP 11–311867 Nov. 9, 1999.
Microlectronic Engineering, 45, 197–208 (1999).
Abstract of JP 03–93229 Apr. 18, 1991.
Abstract of SU 791976 Sep. 7, 1980.
Abstract of GB 1573206 Aug. 20, 1980.
Abstract of WO 94/08276 Apr. 14, 1994.
Abstract of JP 06–73562 Mar. 15, 1991.
Abstract of JP 10–20511 Jan. 23, 1998.
Abstract of JP 11–125917 May 11, 1999.
Abstract of JP 11–133628 May 21, 1999.
Abstract of WO 00/22662 Apr. 20, 2000.
Abstract of EP 1031884 Aug. 31, 2000.
Abstract of DE 2618937 Feb. 17, 1977.

* cited by examiner

Primary Examiner—Randy Gulakowski
Assistant Examiner—M. Kornakov

(57) ABSTRACT

The invention provides aqueous alkaline compositions useful in the microelectronics industry for stripping or cleaning semiconductor wafer substrates by removing photoresist residues and other unwanted contaminants. The compositions typically contain (a) one or more metal ion-free bases at sufficient amounts to produce a pH of about 10–13 and one or more bath stabilizing agents having at least one pKa in the range of 10–13 to maintain this pH during use; (b) optionally, about 0.01% to about 5% by weight (expressed as % $SiO_2$) of a water-soluble metal ion-free silicate; (c) optionally, about 0.01% to about 10% by weight of one or more chelating agents; (d) optionally, about 0.01% to about 80% by weight of one or more water-soluble organic co-solvents; and (e) optionally, about 0.01% to about 1% by weight of a water-soluble surfactant.

60 Claims, No Drawings

STABILIZED ALKALINE COMPOSITIONS FOR CLEANING MICROELECTRONIC SUBSTRATES

RELATED APPLICATION

This application is a continuation-in-part of copending application Ser. No. 09/688,559, filed Oct. 16, 2000 now allowed.

BACKGROUND OF THE INVENTION

FIELD OF THE INVENTION

This invention relates to compositions useful in the microelectronics industry for cleaning semiconductor wafer substrates. Particularly, this invention relates to alkaline stripping or cleaning compositions containing bath stabilizing agents that are used for cleaning wafers having metal lines and vias by removing metallic and organic contamination without damaging the integrated circuits.

DESCRIPTION OF THE PRIOR ART

An integral part of microelectronic fabrication is the use of photoresists to transfer an image from a mask or reticle to the desired circuit layer. After the desired image transfer has been achieved, an etching process is used to form the desired structures. The most common structures formed in this way are metal lines and vias.

The metal lines are used to form electrical connections between various parts of the integrated circuit that lie in the same fabrication layer. The vias are holes that are etched through dielectric layers and later filled with a conductive metal. These are used to make electrical connections between different vertical layers of the integrated circuit. A halogen containing gas is generally used in the processes used for forming metal lines and vias.

After the etching process has been completed, the bulk of the photoresist may be removed by either a chemical stripper solution or by an oxygen plasma ashing process. The problem is that these etching processes produce highly insoluble metal-containing residues that may not be removed by common chemical stripper solutions. Also, during an ashing process the metal-containing residues are oxidized and made even more difficult to remove, particularly in the case of aluminum-based integrated circuits. See, "Managing Etch and Implant Residue," *Semiconductor International, August* 1997, pages 56–63.

An example of such an etching process is the patterning of metal lines on an integrated circuit. In this process, a photoresist coating is applied over a metal film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual metal etching step is then performed. This etching step removes metal not covered by photoresist through the action of a gaseous plasma. Removal of such metal transfers the pattern from the photoresist layer to the metal layer. The remaining photoresist is then removed ("stripped") with an organic stripper solution or with an oxygen plasma ashing procedure. The ashing procedure is often followed by a rinsing step that uses a liquid organic stripper solution. However, the stripper solutions currently available, usually alkaline stripper solutions, leave insoluble metal oxides and other metal-containing residues on the integrated circuit.

Another example of such an etching process is the patterning of vias (interconnect holes) on an integrated circuit. In this process, a photoresist coating is applied over a dielectric film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual dielectric etching step is then performed. This etching step removes dielectric not covered by photoresist through the action of a gaseous plasma. Removal of such dielectric transfers the pattern from the photoresist layer to the dielectric layer. The remaining photoresist is then removed ("stripped") with an organic stripper solution or with an oxygen plasma ashing procedure. Typically, the dielectric is etched to a point where the underlying metal layer is exposed. A titanium or titanium nitride anti-reflective or diffusion barrier layer is typically present at the metal/dielectric boundary. This boundary layer is usually etched through to expose the underlying metal. It has been found that the action of etching through the titanium or titanium nitride layer causes titanium to be incorporated into the etching residues formed inside of the via. Oxygen plasma ashing oxidizes these via residues making them more difficult to remove.

The use of alkaline strippers on microcircuit containing metal films has not always produced quality circuits, particularly when used with metal films containing aluminum or various combinations or alloys of active metals such as aluminum or titanium with more electropositive metals such as copper or tungsten. Various types of metal corrosion, such as corrosion whiskers, pitting, notching of metal lines, have been observed due, at least in part, to reaction of the metals with alkaline strippers. Further it has been shown, by Lee et al., Proc. Interface '89, pp. 137–149, that very little corrosive action takes place until the water rinsing step that is required to remove the organic stripper from the wafer. The corrosion is evidently a result of contacting the metals with the strongly alkaline aqueous solution that is present during rinsing. Aluminum metal is known to corrode rapidly under such conditions, Ambat et al., Corrosion Science, Vol. 33 (5), p. 684. 1992.

Prior methods used to avoid this corrosion problem employed intermediate rinses with non-alkaline organic solvents such as isopropyl alcohol. However, such methods are expensive and have unwanted safety, chemical hygiene, and environmental consequences.

The prior art discloses several organic strippers used to remove bulk photoresist after the etching process. U.S. Pat. Nos. 4,765,844, 5,102,777 and 5,308,745 disclose photoresist strippers comprising various combinations of organic solvents. These strippers, however, are not very effective on wafers that have been "ashed" with oxygen plasmas as described above. Some photoresist strippers attempt to address this problem by adding additional water and an organic corrosion inhibitor such as catechol. Such compositions are disclosed in U.S. Pat. Nos. 5,482,566, 5,279,771, 5,381,807, 5,334,332, 5,709,756, 5,707,947, and 5,419,779 and in WO 9800244. In some cases, the hydrazine derivative, hydroxylamine, is added as well. The use of catechol or hydroxylamine in stripping compositions gives rise to various environmental, safety, and health concerns.

The use of an aqueous solution containing a quaternary ammonium hydroxide and a quaternary ammonium salt of silicic acid or alkyl silicate has been used as photoresist developers for positive tone photoresists in disclosures such as JP 1120552 (published May 12, 1989) and U.S. Pat. No. 4,628,023. Positive tone photoresist developers are used to remove patterned bulk photoresist after exposure to a solublizing radiation source. Developers are used prior to etching for pattern transfer to the exposed metal or dielectric substrate where metallic residues are generated. The object of the use of a quaternary ammonium salt of silicic acid in this disclosure is to prevent corrosion of metal substrates while removing the soluble bulk organic photoresist and not the removal of metal-rich post etch residues present on metal substrates without causing corrosion.

In U.S. Pat. Nos. 6,020,292; 5,817,610 and EP 829,768 the use of a quaternary ammonium silicate, quaternary ammonium hydroxide and water is disclosed for use in removing plasma etch residues. In U.S. Pat. No. 5,759,973 and EP 828,197 the use of a quaternary ammonium silicate, an amine compound, water and optionally an organic polar solvent is disclosed for use as a stripping and cleaning composition. In WO 9960448, many silicate containing compositions are described that effectively remove metal-containing ash residues without causing corrosion.

The use of a quaternary ammonium hydroxide in photoresist strippers is disclosed in U.S. Pat. Nos. 4,776,892, 5,563,119; JP 09319098 A2; EP 578507 A2; WO 9117484 A1 and U.S. Pat. No. 4,744,834. The use of chelating and complexing agents to sequester metals in various cleaners has also been reported in WO 9705228, U.S. Pat. Nos. 5,466,389, 5,498,293, EP 812011, U.S. Pat. No. 5,561,105, JP 06216098, JP 0641773, JP 06250400 and GB 1,573,206.

The use of an alkyl ammonium hydroxide solution containing a surfactant capable of forming a monolayer absorbed onto the sidewall of a patterned metal layer is disclosed in U.S. Pat. No. 6,057,240 for use as a post etch residue remover used in the fabrication process of a microelectonic device.

Photoresist developers containing tetramethylammonium hydroxide have also been disclosed as being useful for removing post via etch polymers in U.S. Pat. Nos. 5,412,868; 5,597,983 and EP 540261 B1.

U.S. Pat. No. 5,466,389 discloses an aqueous alkaline containing cleaning solution for microelectronics substrates that contains a quaternary ammonium hydroxide and optional metal chelating agents and is useful for a pH range of about 8 to 10. In the present invention, a pH greater than 10 is required to effect the desired residue removal.

U.S. Pat. No. 5,498,293 discloses a process for using an aqueous alkaline cleaning solution that contains a quaternary ammonium hydroxide and optional metal chelating agents useful for cleaning silicon wafers. The disclosure of this cleaning process is for treatments to substrates before the presence of integrated metal circuits and is used to generate a wafer surface that is essentially silicon dioxide free and would be employed before the use of photoresist for integrated circuit fabrication. The present invention, in contrast, focuses on the cleaning of wafers with integrated circuits present which have been photoresist coated, etched, and oxygen plasma ashed.

Although the compositions disclosed in WO 9960448 effectively remove all organic contamination and metal-containing residues remaining after a typical etching process, these compositions have a relatively short bath life. There is, therefore, a need for similar compositions with very long bath lives exceeding twenty hours.

SUMMARY OF THE INVENTION

It is, therefore, an object of the present invention to provide compositions useful in the microelectronics industry for cleaning semiconductor wafer substrates.

It is another object of the present invention to provide compositions that remove metallic and organic contamination from semiconductor wafer substrates without damaging the integrated circuits.

It is another object of the present invention to provide compositions that have very long effective bath lives.

It is a further object of the present invention to provide a method for cleaning semiconductor wafer substrates that removes metallic and organic contamination from such substrates without damaging the integrated circuits and avoiding the expense and adverse consequences caused by intermediate rinses.

These and other objects are achieved using new aqueous compositions for stripping or cleaning semiconductor wafer substrates that contain one or more metal ion-free bases and at least one bath stabilizing agent. The compositions are placed in contact with a semiconductor wafer substrate for a time and at a temperature sufficient to clean unwanted contaminants and/or residues from the substrate surface.

Preferably, the compositions contain one or more metal ion-free bases dissolved in water in sufficient amounts to produce a pH of about 10 or greater and a bath stabilizing effective amount, generally about 0.1% to about 50% by weight, of at least one bath stabilizing agent comprising at least one compound with at least one pKa in the range of 10 to 13.

Any suitable base may be used in the compositions of this invention. Preferably, the base is selected from hydroxides and organic amines, most preferably quaternary ammonium hydroxides, ammonium hydroxides and diamines.

Any suitable bath stabilizing agent comprising of at least one pKa in the range of 10 to 13 may be used in the compositions of the present invention. The bath stabilizing agents are preferably compounds with at least one pKa in the range of 11 to 12.5. The most preferable of these compounds are acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine, 1,12-dodecanediamine, 1,3-diaminopentane and orcinol. Other examples of bath stabilizing agents with a pKa in the preferred range of 11 to 12.5 are: hydrogen germanate, adenosine, cytosine, arginine, benzil-α-dioxime, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, diethylbiguanide, diguanide, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, 4-formyl-3-methoxypyridine, guanine, guanosine, 2-hydroxybenzaldehyde oxime, N-(hydroxyethyl) biguanide, 2-hydroxyquinoline, hypoxanthene, inosine, 5-iodohistamine, 2,2'-methylenebis(4-chlorophenol), 2-methyl-8-hydroxyquinoline, 4-methyl-8-hydroxyquinoline, 1-methylxanthine, phenylalanylarginine, silicic acid, sparteine, thorin, toluhydroquinone, tyrosylarginine, xanthosine, acetamidine, trifluoroethanol, trichloroethanol, pyridine-4-aldehyde, hypoxanthine, uric acid, pyrrolidine, diethylamine, piperidine, 3-amino-3-methylpentane, diisopropylamine, saccharin, 2,2,4- trimethylpiperidine, dibutylamine, L-3,4-dihydroxyphenylalanine, 2,2,6,6-tetramethylpiperidine, 5-hydroxytryptamine, butylcyclohexylamine, 2-phenylbenzimidazole, 2-methyl-2-butanethiol, 2-methyl-2-propanethiol, dihexylamine, methoxypyridine, 1,4-dihydroxy-2,3,5,6-tetramethylbenzene, glutarimide, malanonitrile, benzamidine, 4-hydroxyquinoline, 4,4,9,9-tetramethyl-5,8-diazododecane-2,11-diamine, 1,6-hexanediamine, 1,7-heptanediamine, 1,8-octanediamine, 1,9-nonanediamine 1,10-decanediamine, 1,12-dodecanediamine, hydrogen hyponitrite, hydroxylamine-N,N-disulfonic acid, (1,2-cyclohexylenedinitrilo)tetraacetic acid (CYDTA) and diethylenetriaminepenta (methylenephosphonic acid) (DETPA).

Additional examples of bath stabilizing agents with at least one pKa in the 10–11 range are: lysine, tyrosine, 3-amino-N,N-bis(2-aminoethyl)propylamine, tris(2-aminoethyl)amine, 3-(cyclohexylamino)-1-propanesulfonic acid, methylamine, dimethylamine, ethylamine, cysteamine, 1,2-ethanediamine, α-alanine, β-alanine, azetidine, methyiglycine, cysteine, propylamine, 1,3-propanediamine, 4-aminobutanoic acid, 2-methylalanine, homocysteine, 2,4-diaminobutanoic acid, butylamine, 1,4-butanediamine, 2,3-butanediamine, 1,2-dimethylaminoethane, proline, N-methylpyrrolidine, 5-aminopentanoic acid, N-propylglycine, ornithine, 1-amino-2,2-dimethylpropane, diethylmethylamine, 3-methyl-1-butanamine, 2-methyl-2-butanamine, 3-pentanamine, pentylamine, 1,5-pentanediamine, 2-pyridinecarboxaldehyde oxime, hydroquinone, pipecolic acid, cyclohexylamine, 1,2-dimethylpyrrolidine, 1-methylpiperidine, 6-aminohexanoic acid, hexylamine, triethylamine, cresol, 2-dimethylaminopurine, 1,2-dimethylpiperidine, 1-ethylpiperidine, 2-heptanamine, heptylamine, tyramine, dopamine, N-methyl-2-heptanamine, octylamine, 1-butylpiperidine, nonylamine, tryptamine, d-ephedrine, bornylamine, neobornylamine, decylamine, undecylamine, dodecylamine, tridecylamine, tetradecylamine, L-thyroxine, pentadecylamine, hexadecylamine, octadecylamine, 4-aminobutyric acid, 2-amino-2-methylpropionic acid, 3-aminopropionic acid, ethylenediaminetetraacetic acid (EDTA), N,N'-dimethylethyleneamine-N,N'-diacetic acid, methylaminodiacetic acid, 2-methyl-2-propylamine, nitrilotriacetic acid, 1,2,4-triazole, chloral, ethtyl acetoacetate, phenol, β-phenylethylboric acid, nitromethane, thioglycollic acid, ethyl mercaptan, cyanamide, docosylamine, tert-butylamine, trimethylamine, 2-mercaptoethylamine, 5-aminovaleric acid, 4-aminophenol, hydrogen hypoiodite, aminopropylmorpholine, ethanethiol, carbonic acid, tetramethylammonium carbonate, ammonium bicarbonate, ammonium carbonate, choline bicarbonate, carbon dioxide+water, threonine, hydrogen thiophosphate, sarcosine, 4-methoxyphenol, 4-ethoxyphenol, 4-propoxyphenol, 4-butoxyphenol and 4-pentoxyphenol.

Additional examples of bath stabilizing agents with at least one pKa in the 12.5–13 range are: 5-hydroxymethylcytosine, oxaloacetic acid, cumene hydroperoxide, diguanidine, hydrogen sulfide and hydrogen peroxophosphate.

The compositions of the present invention may contain other components such as silicates, chelating agents, organic co-solvents, and surfactants. Chelating agents are preferably present in amounts up to about 2% by weight, organic co-solvents are preferably present in amounts up to about 30% by weight. The compositions can be used to clean substrates containing integrated circuits or can be used to clean substrates that do not contain integrated circuits. When integrated circuits are present, the composition removes the contaminants without damaging the integrated circuits.

The method for cleaning semiconductor wafer substrates of the present invention requires that the compositions of the present invention be placed in contact with a semiconductor wafer substrate for a time and at a temperature sufficient to clean unwanted contaminants and/or residues from the substrate surface. The method includes both bath and spray applications. Typically, the substrate is exposed to the composition for the appropriate time and at the appropriate temperature, rinsed using high purity de-ionized water, and dried.

The compositions clean wafer substrates by removing metallic and organic contamination. Importantly, the cleaning process does not damage integrated circuits on the wafer substrates and avoids the expense and adverse consequences associated with intermediate rinses required in prior methods.

Other objects, advantages, and novel features of the present invention will become apparent in the following detailed description of the invention.

DETAILED DESCRIPTION OF THE INVENTION

The present invention provides new aqueous compositions for stripping or cleaning semiconductor wafer substrates that contain one or more metal ion-free bases and one or more bath stabilizing agents comprising a compound with at least one pKa in the range of 10–13. Preferably, the invention provides aqueous, alkaline stripping or cleaning compositions comprising one or more alkaline metal ion-free base components in an amount sufficient to produce a solution pH of about 10 or greater, preferably from about pH 11 to about pH 13, and one or more bath stabilizing agents comprising a compound with at least one pKa in the range of 10–13, preferably 11–12.5, in a concentration by weight of about 0.1% to about 50%, preferably from about 0.1% to about 35%. In formulations that contain more than about 30% total organics, the pH of the solution should be taken for a 5 wt % solution diluted in de-ionized water.

The compositions may also contain a water-soluble metal ion-free silicate in a concentration by weight of about 0.01% to 5%, and a chelating agent in a concentration by weight of about 0.01% to about 10%, generally from about 0.01% to about 2%. Further optional components are water-soluble organic solvents in a concentration by weight of about 0.1% to about 30%, preferably about 1% to about 30%, and a water-soluble surfactant in an amount by weight of about 0.01% to about 1%, preferably about 0.01% to about 0.5%.

The composition is an aqueous solution containing the base, the bath stabilizing agent, the optional components, if any, and water, preferably high purity de-ionized water.

Any suitable base may be used in the compositions of the present invention. The bases are preferably quaternary ammonium hydroxides, such as tetraalkyl ammonium hydroxides (including hydroxy- and alkoxy-containing alkyl groups generally of from 1 to 4 carbon atoms in the alkyl or alkoxy group) and diamines. The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2- hydroxyethyl ammonium hydroxide, dimethylethyl-2-hydroxyethyl ammonium hydroxide, dimethyldi(2-hydroxyethyl) ammonium hydroxide, monomethyltriethanol ammonium hydroxide, tetraethyl ammonium hydroxide, tetrapropyl ammonium hydroxide, tetrabutyl ammonium hydroxide, tetraethanol ammonium hydroxide, monomethyltriethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof.

Other bases that will function in the present invention include ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino) ethylamine and the like, and other strong organic bases such as guanidine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,12-dodecanediamine, 1,3-pentanediamine, 4-aminomethyl-1,8-octanediamine, aminoethylpiperazine, 4-(3-aminopropyl) morpholine, 1,2-diaminocyclohexane, tris(2-aminoethyl) amine, 2-methyl-1,5-pentanediamine and hydroxylamine. Alkaline solutions containing metal ions such as sodium or potassium may also be operative, but are not preferred because of the possible residual metal contamination that could occur. Mixtures of these additional alkaline components, particularly ammonium hydroxide, with the aforementioned tetraalkyl ammonium hydroxides are also useful.

Any suitable bath stabilizing agent comprising a compound having at least one pKa in the range of 10 to 13, may be used in the compositions of the present invention. The bath stabilizing agents are preferably compounds with at least one pKa in the range of 11 to 12.5. The most preferable of these compounds are acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,6-hexanediamine, 1,8-octanediamine, 1,12-dodecanediamine, 1,3-diaminopentane and orcinol, but are not limited to, those listed herein before in the Summary Of the Invention section. Additional suitable bath stabilizing agents having at least one pKa value of from 10 to 13 can be found listed in "Lange's Handbook of Chemistry", 15$^{th}$ Edition, Section 8, pages 8–24 to 8–79, by J. Dean, "The Determination of Ionization Constants, A Laboratory Manual" by A. Albert and E. Serjeant, 2nd edition, Chapters 6 to 9, pages 72–107, and the "CRC Handbook of Chemistry and Physics", 78$^{th}$ Edition, pages 7-1 to 7-3, 7-6 and 8-43 to 8-55, by D. Lide. Additional compounds with at least one pKa in the 10–13 range can also be found in the computer software programs "NIST Standard Reference Database 46: NIST Critically Selected Stability Constants of metal Complexes Database" available from NIST and the program "ACD/pKa DB" that is available from Advanced Chemistry Development, Inc. of Toronto, Canada. ACD/pKa DB also allows predictions of pKa's from structures. The compounds having at least one pKa in the range of 10–13 useful as bath stabilization agents for this invention are those that when incorporated into a composition for stripping or cleaning integrated circuit substrates provide compositions that evidence less pH drop on aging of the composition compared to an identical composition without the bath stabilization agent. Mixtures of suitable bath stabilizing agents may be used.

Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits.

The compositions of the present invention may also be formulated with suitable metal chelating or complexing agents to increase the capacity of the formulation to retain metals in solution and to enhance the dissolution of metallic residues on the wafer substrate. Typical examples of chelating agents useful for this purpose are the following organic acids and their isomers and salts: (ethylenedinitrilo) tetraacetic acid (EDTA), butylenediaminetetraacetic acid, (1,2-cyclohexylenedinitrilo)tetraacetic acid (CyDTA), diethylenetriaminepentaacetic acid, ethylenediaminetetrapropionic acid, (hydroxyethyl)ethylenediaminetriacetic acid (HEDTA), N,N,N',N'-ethylenediaminetetra (methylenephosphonic)acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, 1,5,9-triazacyclododecane-N,N',N"-tris (methylenephosphonic acid) (DOTRP), 1,4,7,10-tetraazacyclododecane-N,N',N",N'"-tetrakis (methylenephosphonic acid) (DOTP), nitrilotris(methylene) triphosphonic acid, diethylenetriaminepenta (methylenephosphonic acid) (DETAP), aminotri (methylenephosphonic acid), 1-hydroxyethylene-1,1-diphosphonic acid, bis(hexamethylene)triamine phosphonic acid, 1,4,7-triazacyclononane-N,N',N"-tris (methylenephosphonic acid (NOTP), 2-phosphonobutane-1, 2,4-tricarboxylic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, 5-sulfosalicylic acid, catechol, gallic acid, propyl gallate, pyrogallol, 8-hydroxyquinoline, and cysteine. Examples of complexing agents are phosphoric acid, nitric acid, sulfuric acid, hydrochloric acid and hydrofluoric acid. A phosphonic acid or CyDTA chelating agent is preferably employed when the composition contains an oxidizing bath stabilizing agent, such as hydrogen peroxide. Chelating agents such as EDTA are not nearly as oxidation resistant as CyDTA and phosphonic acid chelating agents.

Preferred chelating agents are aminocarboxylic acids such as EDTA or CyDTA and phosphonic acids. Many aminocarboxylic acids and phosphonic acid chelating agents have at least one pKa in the 10–13 range. Chelating agents of this class have a high affinity for the aluminum-containing residues typically found on metal lines and vias after plasma "ashing". In addition, the pKa's for this class of chelating agents typically include one pKa of approximately 12 which improves the performance of the compositions of the invention.

The compositions of the present invention may also contain one or more suitable water-soluble organic solvents. Among the various organic solvents suitable are alcohols, polyhydroxy alcohols, glycols, glycol ethers, alkylpyrrolidinones such as N-methylpyrrolidinone (NMP), 1-hydroxyalkyl-2-pyrrolidinones such as 1-(2-hydroxyethyl)-2-pyrrolidinone (HEP), dimethylformamide (DMF), dimethylacetamide (DMAc), sulfolane, dimethyl-2-piperidone (DMPD) or dimethylsulfoxide (DMSO). These solvents may be added to reduce aluminum and/or aluminum-copper alloy and/or copper corrosion rates if further aluminum and/or aluminum-copper alloy and/or copper corrosion inhibition is desired. Preferred water-soluble organic solvents are polyhydroxy alcohols such as glycerol and/or 1-hydroxyalkyl-2-pyrrolidinones such as 1-(2-hydroxyethyl)-2-pyrrolidinone (HEP).

The compositions of the present invention may also contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired.

Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof.

Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics.

Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols.

Anionic surfactants useful in the compositions of the present invention include carboxylates, N-acylsarcosinates, sulfonates, sulfates, and mono and diesters of orthophosphoric acid such as decyl phosphate. Preferably, the anionic surfactants are metal-free surfactants.

Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants.

In a preferred embodiment of the present invention, the composition is an aqueous solution containing about 0.1–25%, more preferably about 0.1–12%, by weight tetramethylammonium hydroxide (TMAH) and about 0.1% to about 35% by weight sulfosalicylic acid, phosphoric acid, hydrogen peroxide, 2-hydroxypyridine, 4-hydroxypyridine, resorcinol or 2-methylresircinol.

In another embodiment of the present invention, the composition is an aqueous solution containing about 0.1–5% by weight tetramethylammonium hydroxide (TMAH), about 0.1% to about 3% by weight sulfosalicylic acid or phosphoric acid, about 0.01–1% by weight trans-(1,2-cyclohexylenedinitrilo)tetraacetic acid (CyDTA), and about 0–1% by weight (calculated as % $SiO_2$) tetramethylammonium silicate (TMAS).

In another embodiment of the present invention, the composition is an aqueous solution containing about 0.1–5% by weight tetramethylammonium hydroxide (TMAH), about 0.01–1% by weight trans-(1,2-cyclohexylenedinitrilo)tetraacetic acid (CyDTA), about 0.1% to about 3% by weight sulfosalicylic acid or phosphoric acid, about 0–1% by weight (calculated as % $SiO_2$) tetramethylammonium silicate (TMAS), and about 0.5–30% by weight of polyhydroxy compounds, preferably glycerol.

In another embodiment of the present invention, the composition is an aqueous solution containing about 0.1–3% by weight tetramethylammonium hydroxide (TMAH), about 0.1% to about 3% by weight sulfosalicylic acid or phosphoric acid, about 0.01–1% by weight trans-(1,2-cyclohexylenedinitrilo)tetraacetic acid (CyDTA), about 0–1% by weight (calculated as % $SiO_2$) tetramethylammonium silicate (TMAS), about 0.5–30% by weight of polyhydroxy compounds, and about 0.01–0.3% by weight of a nonionic ethoxylated acetylenic diol surfactant.

In another embodiment of the present invention, the composition is an aqueous solution containing about 0.1–5% by weight tetramethylammonium hydroxide (TMAH), about 0.1% to about 3% by weight hydrogen peroxide or salicylic acid, about 0.01–1% by weight trans-(1,2-cyclohexylenedinitrilo)tetraacetic acid (CyDTA), and about 0–1% by weight (calculated as % $SiO_2$) tetramethylammonium silicate (TMAS).

In another embodiment of the present invention, the composition is an aqueous solution containing about 0.1–5% by weight tetramethylammonium hydroxide (TMAH), about 0.01–1% by weight trans-(1,2-cyclohexylenedinitrilo)tetraacetic acid (CyDTA), about 0.1% to about 3% by weight hydrogen peroxide or salicylic acid, about 0–1% by weight (calculated as % $SiO_2$) tetramethylammonium silicate (TMAS), and about 0.5–30% by weight of polyhydroxy compounds, preferably glycerol.

In another embodiment of the present invention, the composition is an aqueous solution containing about 0.1–3% by weight tetramethylammonium hydroxide (TMAH), about 0.1% to about 3% by weight hydrogen peroxide or salicylic acid, about 0.01–1% by weight trans-(1,2-cyclohexylenedinitrilo)tetraacetic acid (CyDTA), about 0–1% by weight (calculated as % $SiO_2$) tetramethylammonium silicate (TMAS), about 0.5–30% by weight of polyhydroxy compounds, and about 0.01–0.3% by weight of a nonionic ethoxylated acetylenic diol surfactant.

In another embodiment of the present invention, the composition is an aqueous solution containing about 0.1–2% by weight tetramethylammonium hydroxide (TMAH), about 0.01–1% by weight trans-(1,2-cyclohexylenedinitrilo)tetraacetic acid (CyDTA), about 0–1% by weight (calculated as % $SiO_2$) tetramethylammonium silicate (TMAS), about 0.1% to about 3% by weight hydrogen peroxide or salicylic acid and about 0.5–30% by weight of an alkyl-pyrrolidinone such as 1-(2-hydroxyethyl)-2-pyrrolidinone (HEP), preferably 1-(2-hydroxyethyl)-2-pyrrolidinone (HEP).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0–1% by weight (calculated as % $SiO_2$) tetramethylammonium silicate (TMAS), about 0.1% to about 3% by weight hydrogen peroxide or salicylic acid, about 0.5–30% by weight of an alkyl-pyrrolidinone such as 1-(2-hydroxyethyl)-2-pyrrolidinone (HEP), and about 0.01–0.3% by weight of a nonionic ethoxylated acetylenic diol surfactant.

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.1% to about 3% by weight sulfosalicylic acid or phosphoric acid, about 0–1% by weight (calculated as % $SiO_2$) tetramethylammonium silicate (TMAS), and about 0.5–30% by weight of an alkyl-pyrrolidinone such as 1-(2-hydroxyethyl)-2-pyrrolidinone (HEP), preferably 1-(2-hydroxyethyl)-2-pyrrolidinone (HEP).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.1% to about 3% by weight sulfosalicylic acid or phosphoric acid, about 0–1% by weight (calculated as % $SiO_2$) tetramethylammonium silicate (TMAS), about 0.5–30% by weight of an alkyl-pyrrolidinone such as 1-(2-hydroxyethyl)-2-pyrrolidinone (HEP), and about 0.01–0.3% by weight of a nonionic ethoxylated acetylenic diol surfactant.

In another embodiment of the present invention, the composition is an aqueous solution containing about 0.1–5% by weight tetramethylammonium hydroxide (TMAH), about 0.01–1% by weight diethylenetriaminepenta (methylenephosphonic acid), about 0.1% to about 3% by weight hydrogen peroxide and about 0–1% by weight (calculated as % $SiO_2$) tetramethylammonium silicate (TMAS).

In another embodiment of the present invention, the composition is an aqueous solution containing about 0.1–25% by weight tetramethylammonium hydroxide (TMAH), about 0.1% to about 20% by weight hydroxylamine, about 0.1% to about 35% by weight 2-hydroxypyridine or 4-hydroxypyridine, about 0–1% by weight trans-(1,2-cyclohexylenedinitrilo)tetraacetic acid (CyDTA), about 0–1% by weight (calculated as % $SiO_2$) tetramethylammonium silicate (TMAS) and about 0–0.3% by weight of a nonionic ethoxylated acetylenic diol surfactant.

In another embodiment of the present invention, the composition is an aqueous solution containing about 0.1–10% by weight tetramethylammonium hydroxide (TMAH), about 0.1% to about 15% by weight 2-hydroxypyridine, about 0–1% by weight trans-(1,2-cyclohexylenedinitrilo)tetraacetic acid (CyDTA), about 0–1% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–10% by weight tetramethylammonium hydroxide (TMAH), about 0.1% to about 15% by weight 4-hydroxypyridine, about 0–1% by weight trans-(1,2-cyclohexylenedinitrilo)tetraacetic acid (CyDTA), about 0–1% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–25% by weight tetramethylammonium hydroxide (TMAH), about 0.1% to about 15% by weight resorcinol, about 0–1% by weight trans-(1,2-cyclohexylenedinitrilo) tetraacetic acid (CyDTA), about 0–2% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–4% by weight tetramethylammonium hydroxide (TMAH), about 0.1% to about 4% by weight 2-methylresorcinol, about 0–1% by weight trans-(1,2-cyclohexylenedinitrilo) tetraacetic acid (CyDTA), about 0–2% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–4% by weight tetramethylammonium hydroxide (TMAH), about 0.1% to about 4% by weight orcinol, about 0–1% by weight trans-(1,2-cyclohexylenedinitrilo)tetraacetic acid (CyDTA), about 0–2% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–10% by weight tetramethylammonium hydroxide (TMAH), about 0.1% to about 15% by weight 2-hydroxypyridine, about 0–1% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–10% by weight tetramethylammonium hydroxide (TMAH), about 0.1% to about 15% by weight 4-hydroxypyridine, about 0–1% by weight (calculated as % $SiO_2$) tetramethylammonium silicate (TMAS), about 0–30% by weight of polyhydroxy compounds, and about 0–0.3% by weight of a nonionic ethoxylated acetylenic diol surfactant.

In another embodiment of the present invention, the composition is an aqueous solution containing about 0.1–10% by weight tetramethylammonium hydroxide (TMAH), about 0.1% to about 15% by weight 2-hydroxypyridine, about 0–1% by weight (calculated as % $SiO_2$) tetramethylammonium silicate (TMAS) and about 0–30% by weight of polyhydroxy compounds.

In another embodiment of the present invention, the composition is an aqueous solution containing about 0.1–10% by weight tetramethylammonium hydroxide (TMAH), about 0.1% to about 15% by weight 4-hydroxypyridine, about 0–1% by weight (calculated as % $SiO_2$) tetramethylammonium silicate (TMAS) and about 0–30% by weight of polyhydroxy compounds.

In all the embodiments, the balance of the composition is made up with water, preferably high purity de-ionized water.

The method of the present invention cleans semiconductor wafer substrates by exposing the contaminated substrate to the compositions of the present invention for a time and at a temperature sufficient to clean unwanted contaminants from the substrate surface. Optionally, the substrate is rinsed to remove the composition and the contaminants and dried to remove any excess solvents or rinsing agents. The substrate can then be used for its intended purpose.

Preferably, the method uses a bath or spray application to expose the substrate to the composition. Bath or spray cleaning times are generally 1 minute to 30 minutes, preferably 5 minutes to 20 minutes. Bath or spray cleaning temperatures are generally 10° C. to 85° C., preferably 20° C. to 65° C.

If required, the rinse times are generally 10 seconds to 5 minutes at room temperature, preferably 30 seconds to 2 minutes at room temperature. Preferably de-ionized water is used to rinse the substrates.

If required, drying the substrate can be accomplished using any combination of air-evaporation, heat, spinning, or pressurized gas. The preferred drying technique is spinning under a filtered inert gas flow, such as nitrogen, for a period of time until the wafer substrate is dry.

The method of the present invention is very effective for cleaning semiconductor wafer substrates that have been previously oxygen plasma ashed to remove bulk photoresist, particularly wafer substrates containing a silicon, silicon oxide, silicon nitride, tungsten, tungsten alloy, titanium, titanium alloy, tantalum, tantalum alloy, copper, copper alloy, aluminum or aluminum alloy film. The method removes unwanted metallic and organic contaminants but does not cause unacceptable corrosion to the silicon, silicon oxide, silicon nitride, tungsten, tungsten alloy, titanium, titanium alloy, tantalum, tantalum alloy, copper, copper alloy, aluminum or aluminum alloy film.

The following examples illustrate the specific embodiment of the invention described in this document. As would be apparent to skilled artisans, various changes and modifications are possible and are contemplated within the scope of the invention described.

EXAMPLES

The percentages given in the examples are by weight unless specified otherwise. The amount of aluminum or aluminum-copper alloy metal corrosion is expressed as both percent metal loss and as a general corrosion remark. The general corrosion remarks given are very slight, slight, light, moderate and severe. A small amount of metal corrosion that was considered to be within acceptable limits were assigned very slight or slight. Light, moderate or severe corrosion were considered to be unacceptable. All cleaning and corrosion data entries generated using a Field Emission Scanning Electron Microscope (FE-SEM) were based on a visual interpretation of differences between untreated and treated samples from the same wafer.

The small beaker aging tests were conducted in 100 ml or 150 ml uncovered glass beakers placed in a chemical fume hood for 16 or 20 hours at room temperature without stirring. Large beaker aging tests were conducted in uncovered 4-liter (4 L) glass beakers placed in a chemical fume hood with stirring done at a rate of 150 RPM using a magnetic stir-bar for 12 to 29 hours. The 4-liter beaker aging tests were all conducted at temperatures above room temperature (noted in the tables below). A portion of the same unaged batch of solution was also kept in a sealed poly bottle for comparison. At the completion of the aging tests the solutions were placed into poly bottles then sealed for later pH comparison measurements. In Examples 1 to 3 and Example 11, pH measurement shown were done using a glass combination electrode standardized with pH 4 and pH 10 buffers. In Examples 4 to 10, pH measurements shown were done using a glass combination electrode standardized with pH 7 and pH 10 buffers. The pH meter was re-standardized after the completion of one set of unaged/aged solutions (maximum of two solutions per standardization) to ensure accurate pH comparison measurements.

The pKa values shown in the tables below were primarily obtained from the "Lange's Handbook of Chemistry", 15th Edition, Section 8, pages 8–24 to 8–79, by J. Dean, "The Determination of Ionization Constants, A Laboratory Manual" by A. Albert and E. Serjeant, 2nd edition, Chapters 6 to 9, pages 72–107, and the "CRC Handbook of Chemistry and Physics", 78th Edition, pages 7-1 to 7-3, 7-6 and 8-43 to 8-55, by D. Lide. All pka's shown are for room temperature (18–25° C.).

Example 1

Aqueous solution "A1" was prepared with 2.4 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 3.0 weight percent glycerol and 0.9 weight percent salicylic acid (remainder of this solution being made up with de-ionized water) and has a pH of about 12.5.

Aqueous solution "A2" was prepared with 3.2 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 3.0 weight percent glycerol and 2.2 weight percent salicylic acid (remainder of this solution being made up with de-ionized water) and has a pH of about 12.5.

Aqueous solution "A3" was prepared with 1.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol and 0.9 weight percent salicylic acid (remainder of this solution being made up with de-ionized water) and has a pH of about 12.5.

Aqueous solution "A4" was prepared with 9.2 weight percent tetramethylammonium hydroxide (TMAH), 0.06 weight percent of the non-ionic surfactant Surfynol-465 (a product of Air Products and Chemicals, Inc.), 0.9 weight percent glacial acetic acid, 3.0 weight percent glycerol and 0.9 weight percent salicylic acid (remainder of this solution being made up with de-ionized water) and has a pH of about 12.5.

Aqueous solution "A5" was prepared with 2.4 weight percent tetramethylammonium hydroxide (TMAH), 0.1 weight percent trans-(1,2-cyclohexylenedinitrilo)tetraacetic acid (CyDTA), 0.9 weight percent glacial acetic acid, 3.0 weight percent glycerol and 0.9 weight percent salicylic acid (remainder of this solution being made up with de-ionized water) and has a pH of about 12.5.

Aqueous solution "A6" was prepared with 4.2 weight percent tetramethylammonium (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 2.2 weight percent glacial acetic acid, 3.0 weight percent glycerol and 0.9 weight percent salicylic acid (remainder of this solution being made up with de-ionized water) and has a pH of about 12.5.

Aqueous solution "A7" was prepared with 3.1 weight percent tetramethylammonium hydroxide (TMAH), 1.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 3.0 weight percent glycerol and 0.9 weight percent salicylic acid (remainder of this solution being made up with de-ionized water) and has a pH of about 12.5.

Aqueous solution "A8" was prepared with 2.4 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 1.0 weight percent glacial acetic acid and 1.0 weight percent salicylic acid (remainder of this solution being made up with de-ionized water).

Aqueous solution "A9" was prepared with 2.3 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 6.0 weight percent glycerol and 0.9 weight percent salicylic acid (remainder of this solution being made up with de-ionized water).

Aqueous solution "A10" was prepared with 2.1 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 0.9 weight percent glacial acetic acid, 3.0 weight percent glycerol and 0.9 weight percent acetone oxime (remainder of this solution being made up with de-ionized water) and has a pH of about 12.3.

Aqueous solution "A11" was prepared with 2.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol and 0.8 weight percent phosphoric acid (remainder of this solution being made up with de-ionized water) and has a pH of about 12.2.

Wafer #1 samples with 0.35 micron wide via features had been previously prepared using a via-first dual-damascene process with the following layers present: Si wafer base, copper metal, silicon nitride, fluorinated silica glass (FSG) dielectric, silicon nitride etch-stop, FSG and anti-reflective coating (ARC) layers. Lithographic patterning was done using a deep ultraviolet (DUV) photoresist material. Reactive ion etching for pattern transfer was followed by oxygen plasma ashing to remove organic photoresist residues, but leaving mainly inorganic residues behind. A wafer sample was placed in each of these solutions at 24–55° C. for 20 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the copper metal features. The results are shown in Table 1.

TABLE 1

FE-SEM Evaluation Results

| Solution | Description | Bath Stabilizing Agent Used | pKa of Bath Stabilizing Agent Used (at 25° C.) | Temp. (° C.) | Post-Ash Residue Removed (%) | Copper Metal Corrosion (% Metal Loss) |
|---|---|---|---|---|---|---|
| A1 | No silicate content. | Salicylic Acid | $pKa_2 = 12.4$ | 24 | 88 | 1 (very slight) |
| | | | | 35 | 100 | 3 (very slight) |
| | | | | 45 | 100 | 3 (very slight) |
| | | | | 55 | 100 | 4 (very slight) |
| A2 | A1 with 2.4x amount of bath stabilizing agent | Salicylic Acid | $pKa_2 = 12.4$ | 45 | 100 | 7 (slight) |
| A3 | A1 with acetic acid removed | Salicylic Acid | $pKa_2 = 12.4$ | 45 | 100 | 5 (slight) |
| A4 | A1 with chelating agent removed | Salicylic Acid | $pKa_2 = 12.4$ | 45 | 100 | 4 (very slight) |
| A5 | A1 with surfactant removed | Salicylic Acid | $pKa_2 = 12.4$ | 45 | 100 | 7 (slight) |
| A6 | A1 with 2.4x amount of acetic acid | Salicylic Acid | $pKa_2 = 12.4$ | 45 | 100 | 5 (slight) |
| A7 | A1 with 10x amount of chelating agent | Salicylic Acid | $pKa_2 = 12.4$ | 45 | 100 | 7 (slight) |

TABLE 1-continued

FE-SEM Evaluation Results

| Solution | Description | Bath Stabilizing Agent Used | pKa of Bath Stabilizing Agent Used (at 25° C.) | Temp. (° C.) | Post-Ash Residue Removed (%) | Copper Metal Corrosion (% Metal Loss) |
|---|---|---|---|---|---|---|
| A8 | A1 with co-solvent removed | Salicylic Acid | $pKa_2 = 12.4$ | 24 | 98 | 1 (very slight) |
|  |  |  |  | 35 | 100 | 3 (very slight) |
|  |  |  |  | 45 | 100 | 5 (slight) |
| A9 | A1 with 2x amount of co-solvent added | Salicylic Acid | $pKa_2 = 12.4$ | 45 | 100 | 3 (very slight) |
| A10 | A1 with acetone oxime bath stabilizer substituted for salicylic acid | Acetone Oxime | $pKa = 12.2$ | 45 | 100 | 6 (slight) |
| A11 | A1 with phosphoric acid bath stabilizer substituted for salicylic acid | Phosphoric Acid | $pKa_3 = 12.3$ | 45 | 99 | 1 (very slight) |

Referring to Table 1, the data shows the ability of stabilized, aqueous, alkaline solutions to successfully remove post-etch/ash residues from a semiconductor wafer over a temperature range of about 24–55° C. This table also shows the ability to substitute different bath stabilizing agents and still maintain the cleaning efficiency of the solution.

Example 2

Aqueous solution "B1" was prepared with 2.5 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.14 weight percent (calculated as % $SiO_2$) tetramethylammonium silicate (TMAS), 0.95 weight percent glacial acetic acid and 0.8 weight percent 5-sulfosalicylic acid (remainder of this solution being made up with de-ionized water) and has a pH of about 12.1.

Aqueous solution "B2" was prepared with 1.1 weight percent tetramethylammonium hydroxide (TMAH), 0.1 weight percent trans-(1,2-cyclohexylenedinitrilo)tetraacetic acid (CyDTA), 0.08 weight percent of the non-ionic surfactant Surfynol-465 (a product of Air Products and Chemicals, Inc.), 3.0 weight percent glycerol, 0.14 weight percent (calculated as % $SiO_2$) tetramethylammonium silicate (TMAS) and 0.8 weight percent 5-sulfosalicylic acid (remainder of this solution being made up with de-ionized water) and has a pH of about 12.1.

Aqueous solution "B3" was prepared with 3.2 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.14 weight percent (calculated as % $SiO_2$) tetramethylammonium silicate (TMAS) and 2.9 weight percent 5-sulfosalicylic acid (remainder of this solution being made up with de-ionized water) and has a pH of about 12.1.

Aqueous solution "B4" was prepared with 1.9 weight percent tetramethylammonium hydroxide (TMAH), 0.08 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 24 weight percent glycerol, 0.11 weight percent (calculated as % $SiO_2$) tetramethylammonium silicate (TMAS), 0.7 weight percent glacial acetic acid and 0.6 weight percent 5-sulfosalicylic acid (remainder of this solution being made up with de-ionized water).

Aqueous solution "B5" was prepared with 1.9 weight percent tetramethylammonium hydroxide (TMAH), 0.08 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 27 weight percent glycerol, 0.10 weight percent (calculated as % $SiO_2$) tetramethylammonium silicate (TMAS), 0.7 weight percent glacial acetic acid and 0.6 weight percent 5-sulfosalicylic acid (remainder of this solution being made up with de-ionized water).

Aqueous solution "C" was prepared with 2.5 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 1.0 weight percent (calculated as % $SiO_2$) tetramethylammonium silicate (TMAS), 0.9 weight percent glacial acetic acid and 0.9 weight percent salicylic acid (remainder of this solution being made up with de-ionized water) and has a pH of about 12.5.

Aqueous solution "D" was prepared with 3.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.28 weight percent (calculated as % $SiO_2$) tetramethylammonium silicate (TMAS) and 3.0 weight percent 5-sulfosalicylic acid (remainder of this solution being made up with de-ionized water) and has a pH of about 12.1.

Aqueous solution "E1" was prepared with 3.2 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.22 weight percent (calculated as % $SiO_2$) tetramethylammonium silicate (TMAS) and 2.9 weight percent 5-sulfosalicylic acid (remainder of this solution being made up with de-ionized water) and has a pH of about 12.1.

Aqueous solution "E2" was prepared with 3.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 9.0 weight percent glycerol, 0.21 weight percent (calculated as % $SiO_2$) tetramethylammonium silicate (TMAS) and 2.8 weight percent 5-sulfosalicylic acid (remainder of this solution being made up with de-ionized water).

Aqueous solution "E3" was prepared with 2.7 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 18 weight percent glycerol, 0.12 weight percent (calculated as % $SiO_2$) tetramethylammonium silicate (TMAS) and 2.5 weight percent 5-sulfosalicylic acid (remainder of this solution being made up with de-ionized water).

Aqueous solution "F1" was prepared with 4.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 0.28 weight percent (calculated as % $SiO_2$) tetramethylammonium silicate (TMAS) and 1.6 weight percent phosphoric acid (remainder of this solution being made up with de-ionized water) and has a pH of about 12.1.

Aqueous solution "F2" was prepared with 2.5 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 0.26 weight percent (calculated as % $SiO_2$) tetramethylammonium silicate (TMAS) and 0.97 weight percent phosphoric acid (remainder of this solution being made up with de-ionized water) and has a pH of about 12.1.

Aqueous solution "F3" was prepared with 1.5 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 0.22 weight percent (calculated as % $SiO_2$) tetramethylammonium silicate (TMAS) and 0.53 weight percent phosphoric acid (remainder of this solution being made up with de-ionized water) and has a pH of about 12.1.

Aqueous solution "G" was prepared with 2.0 weight percent tetramethylammonium hydroxide (TMAH), 0.1 weight percent trans-(1,2-cyclohexylenedinitrilo)tetraacetic acid (CyDTA), 0.15 weight percent (calculated as % $SiO_2$) tetramethylammonium silicate (TMAS) and 1.6 weight percent hydrogen peroxide (remainder of this solution being made up with de-ionized water) and has a pH of about 11.5.

Wafer #1 samples with 0.35 micron wide via features had been previously prepared using a via-first dual-damascene process with the following layers present: Si wafer base, copper metal, silicon nitride, fluorinated silica glass (FSG) dielectric, silicon nitride etch-stop, FSG and anti-reflective coating (ARC) layers. Lithographic patterning was done using a deep ultraviolet (DUV) photoresist material. Reactive ion etching for pattern transfer was followed by oxygen plasma ashing to remove organic photoresist residues, but leaving mainly inorganic residues behind. Wafer #2 samples with one micron wide features and Aluminum-Copper raised lines capped with titanium-nitride, were previously prepared as follows: (a) a coating of spin-on-glass was applied to a silicon wafer and cured (b) a titanium adhesion layer was applied (c) a titanium nitride layer was deposited (d) metallization with an aluminum-1% copper alloy (e) a titanium nitride capping layer was deposited (f) lithographic patterning using a photoresist material (g) pattern transfer using reactive ion etching and (h) oxygen plasma ashing to remove organic photoresist residues, but leaving mainly inorganic residues behind. Wafer samples #3 through #6 have 0.35 micron wide features and Aluminum-Copper raised lines capped with titanium-nitride, were previously prepared as follows: (a) a coating of spin-on-glass was applied to a silicon wafer and cured (b) a titanium adhesion layer was applied (c) a titanium nitride layer was deposited (d) metallization with an aluminum-1% copper alloy (e) a titanium nitride capping layer was deposited (f) lithographic patterning using a photoresist material (g) pattern transfer using reactive ion etching and (h) oxygen plasma ashing to remove organic photoresist residues, but leaving mainly inorganic residues behind. Wafer sample #7 with 0.3–0.5 micron wide by 0.5 micron deep holes (vias) through dielectric and titanium nitride layers exposing aluminum-copper alloy metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic residues behind, were used to evaluate the performance of the solutions. A wafer sample was placed in each of these solutions at 22–65° C. for 10–60 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the metal features. The results are shown in Table 2.

TABLE 2

FE-SEM Evaluation Results

| Solution | Description | Bath Stabilizing Agent Used | pKa of Bath Stabilizing Agent Used (at 25° C.) | Wafer Sample Number Tested (1 = Cu-based, 2–7 = Al/Cu alloy based) | Time (min.)/ Temp. (° C.) | Post-Ash Residue Removed (%) | Copper Metal Corrosion (% Metal Loss) |
|---|---|---|---|---|---|---|---|
| B1 | Contains silicate. | 5-sulfosalicylic Acid | $pKa_2 = 12.0$ | 2 | 10/22 | 100 | 0 |
| | | | | 1 | 20/35 | 95 | 0 |
| | | | | 1 | 20/45 | 100 | 4 (very slight) |
| | | | | 1 | 20/55 | 100 | 6 (slight) |
| | | | | 3 | 20/25 | 100 | 15 (light) |
| B2 | B1 with acetic acid removed | 5-sulfosalicylic Acid | $pKa_2 = 12.0$ | 2 | 10/22 | 100 | 1 (very slight) |
| | | | | 1 | 20/35 | 98 | 1 (very slight) |
| | | | | 1 | 20/45 | 100 | 5 (slight) |
| | | | | 1 | 20/55 | 100 | 7 (slight) |
| B3 | B1 with 3.6x amount of bath stabilizing agent | 5-sulfosalicylic Acid | $pKa_2 = 12.0$ | 2 | 10/22 | 100 | 1 (very slight) |
| | | | | 1 | 20/24 | 50 | 0 |
| | | | | 1 | 20/35 | 70 | 0 |
| | | | | 1 | 20/45 | 100 | 5 (slight) |
| | | | | 1 | 20/55 | 100 | 7 (slight) |
| | | | | 1 | 20/65 | 100 | 10 (light) |
| B4 | B1 with 6x co-solvent added | 5-sulfosalicylic Acid | $pKa_2 = 12.0$ | 3 | 60/35 | 100 | 5 (slight) |
| B5 | B1 with 7x co-solvent added | 5-sulfosalicylic Acid | $pKa_2 = 12.0$ | 3 | 60/35 | 100 | 3 (very slight) |
| B6 | B1 with 8x co-solvent added | 5-sulfosalicylic Acid | $pKa_2 = 12.0$ | 3 | 60/35 | 99 | 0 |
| B7 | B1 with 9x co-solvent added | 5-sulfosalicylic Acid | $pKa_2 = 12.0$ | 3 | 60/35 | 95 | 0 |
| C | Contains silicate. | Salicylic acid | $pKa_2 = 12.4$ | 2 | 10/22 | 100 | 0 |
| | | | | 1 | 20/35 | 90 | 2 (very slight) |
| | | | | 1 | 20/45 | 99 | 5 (slight) |
| | | | | 1 | 20/55 | 100 | 5 (slight) |
| | | | | 1 | 20/65 | 100 | 8 (slight) |
| D | Contains silicate. | 5-sulfosalicylic Acid | $pKa_2 = 12.0$ | 5 | 10/25 | 100 | 0 |
| | | | | 5 | 40/25 | 100 | 8 (slight) |
| E1 | Contains silicate. | 5-sulfosalicylic Acid | $pKa_2 = 12.0$ | 5 | 10/25 | 100 | 0 |
| | | | | 5 | 40/25 | 100 | 9 (slight) |
| | | | | 6 | 20/30 | 100 | 2 (very slight) |
| E2 | E1 with 3x co-solvent added | 5-sulfosalicylic Acid | $pKa_2 = 12.0$ | 5 | 40/25 | 100 | 1 (very slight) |
| E3 | E1 with 50% silicate content and with 6x co-solvent added | 5-sulfosalicylic Acid | $pKa_2 = 12.0$ | 5 | 40/25 | 100 | 9 (slight) |
| F1 | Contains silicate. | Phosphoric Acid | $pKa_3 = 12.3$ | 5 | 40/25 | 100 | 9 (slight) |

TABLE 2-continued

FE-SEM Evaluation Results

| Solution | Description | Bath Stabilizing Agent Used | pKa of Bath Stabilizing Agent Used (at 25° C.) | Wafer Sample Number Tested (1 = Cu-based, 2–7 = Al/Cu alloy based) | Time (min.)/ Temp. (° C.) | Post-Ash Residue Removed (%) | Copper Metal Corrosion (% Metal Loss) |
|---|---|---|---|---|---|---|---|
| | | | | 6 | 15/30 | 100 | 1 (very slight) |
| | | | | 6 | 20/30 | 100 | 3 (very slight) |
| | | | | 6 | 10/35 | 100 | 3 (very slight) |
| F2 | F1 with 40% less bath stabilizing agent added | Phosphoric Acid | $pKa_3 = 12.3$ | 5 | 40/25 | 100 | 9 (slight) |
| | | | | 6 | 15/30 | 100 | 3 (very slight) |
| | | | | 6 | 20/30 | 100 | 5 (slight) |
| | | | | 6 | 10/35 | 100 | 5 (slight) |
| F3 | F1 with 66% less bath stabilizing agent added | Phosphoric Acid | $pKa_3 = 12.3$ | 5 | 40/25 | 100 | 9 (slight) |
| | | | | 6 | 15/30 | 100 | 2 (very slight) |
| | | | | 6 | 20/30 | 100 | 4 (very slight) |
| | | | | 6 | 10/35 | 100 | 5 (slight) |
| G | Contains silicate. | Hydrogen Peroxide | $pKa = 11.6$ | 7 | 10/45 | 100 | 5 (slight) |

Referring to Table 2, the data shows the ability of stabilized, aqueous, alkaline solutions containing silicate to successfully remove post-etch/ash residues from a semiconductor wafers over a temperature range of about 25–65° C. This table also shows the ability to substitute different bath stabilizing agents with different pKa values and still maintain the cleaning efficiency of the solution.

Example 3

Aqueous solution "H" was prepared (without any bath stabilizing agent added) with 0.2 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol and 0.14 weight percent (calculated as % $SiO_2$) tetramethylammonium silicate (TMAS) (remainder of this solution being made up with de-ionized water) and has a pH of about 12.0.

Comparative 4 L uncovered baths were set up in a chemical fume hood with an air-flow rate of about 100 feet per minute (FPM) over the baths. The temperature of the baths was maintained by use of programmable digital hot plates with a bath temperature monitoring probe. Wafer samples were processed during the aging of the solutions so as to determine its performance bath-life. A description of the solutions used for the comparisons is discussed above in Examples 1 and 2. A wafer sample was placed in each of these solutions at 30–55° C. for 10–20 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the metal features. The bath aging results are shown in Table 3a.

TABLE 3

FE-SEM Evaluation Results for Aged Solutions

| Solution | Bath Stabilizing Agent Added | Amount of Bath Stabilizing Agent Added (Weight %) | Bath Aging Temp. (° C.) | Wafer Sample Number | Wafer Sample Process Conditions (min./° C.) | Bath Aging time with Successful Cleaning of Samples (Hours) |
|---|---|---|---|---|---|---|
| H | none | 0 | 35 | 6 | 20/35 | 12 |
| E1 | 5-Sulfosalicylic Acid | 2.9 | 30 | 6 | 20/30 | 28 |
| F1 | Phosphoric Acid | 1.6 | 35 | 6 | 10/35 | 29 |

TABLE 3-continued

FE-SEM Evaluation Results for Aged Solutions

| Solution | Bath Stabilizing Agent Added | Amount of Bath Stabilizing Agent Added (Weight %) | Bath Aging Temp. (° C.) | Wafer Sample Number | Wafer Sample Process Conditions (min./° C.) | Bath Aging time with Successful Cleaning of Samples (Hours) |
|---|---|---|---|---|---|---|
| F2 | Phosphoric Acid | 0.97 | 30 | 6 | 20/30 | 20 |
| F3 | Phosphoric Acid | 0.53 | 30 | 6 | 20/30 | 24 |
| A1 | Salicylic Acid | 0.93 | 45 | 1 | 20/45 | 24 |
| B1 | 5-Sulfosalicylic Acid | 0.82 | 45 | 1 | 20/45 | 24 |
| C | Salicylic Acid | 0.94 | 55 | 1 | 20/55 | 24 |
| G | Hydrogen Peroxide | 1.6 | 45 | 7 | 10/45 | 24 |

Referring to Table 3, the data clearly shows the ability of stabilized, aqueous, alkaline solutions to successfully remove post-etch/ash residues from semiconductor wafers for a longer period of time in an aged open bath. This table clearly shows that the lack of a stabilizing agent results in a bath-life that is unacceptably short. This table also shows the ability to substitute different bath stabilizing agents and still maintain the cleaning efficiency of the solution.

Example 4

Aqueous, unstabilized stock solution "K1" was prepared with 0.18 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 0.14 weight percent (calculated as % $SiO_2$) tetramethylammonium silicate (TMAS) and 6.0 weight percent glycerol (remainder of this solution being made up with de-ionized water) and has a pH of about 11.78 at 25.0° C.

Aqueous, stabilized solution "K40" was prepared with 100.00 g of stock solution "K1", 10.21 g of 25.2 wt. % tetramethylammonium carbonate and 0.24 g of 24.85 wt. % TMAH (remainder of this solution being made up with de-ionized water) and has a pH of about 11.76 at 25.0° C. Aqueous, stabilized solution "K41" was prepared with 2.6 weight percent tetramethylammonium hydroxide (TMAH), 5.0 weight percent of the bath stabilizing agent 2-hydroxypyridine, 0.05 weight percent of the non-ionic surfactant Surfynol-465 (a product of Air Products and Chemicals, Inc.), 0.12 weight percent (calculated as % $SiO_2$) tetramethylammonium silicate (TMAS), 5.2 weight percent glycerol and 0.09 weight percent of the metal chelating agent trans-(1,2-cyclohexylenedinitrilo)tetraacetic acid (CyDTA) with the remainder of this solution being made up with de-ionized water and has a pH of about 11.90 at 25.0° C. Aqueous, stabilized solution "K42" was prepared with 2.5 weight percent tetramethylammonium hydroxide (TMAH), 5.0 weight percent of the bath stabilizing agent 2-hydroxypyridine, 0.05 weight percent of the non-ionic surfactant Surfynol-465 (a product of Air Products and Chemicals, Inc.), 0.12 weight percent (calculated as % $SiO_2$) tetramethylammonium silicate (TMAS), 5.2 weight percent glycerol with the remainder of this solution being made up with de-ionized water and has a pH of about 11.89 at 25.0° C.

Stabilized solutions were prepared by adding a bath stabilizing agent to 200.1 g of the above stock solution and adjusting the pH back to about 11.8 with 24.85% TMAH, if necessary. Table 4a summarizes the results of the small beaker aging test for potential bath stabilizing agents with a pKa in the 10–13 range. If a bath stabilizing agent has more than one pKa associated with it, then only the pKa in the 10–13 range is shown in Table 4a. The pH drop comparison was done by measuring the pH of the solution aged in a sealed poly bottle and compare it to the same solution aged in an uncovered 100 ml small beaker for 20 hours at room temperature.

Table 4b summarizes the results of the small beaker aging test for potential bath stabilizing agents with a pKa in the 10–13 range. If a bath stabilizing agent has more than one pKa associated with it, then only the pKa in the 10–13 range is shown in Table 4b. The pH drop comparison was done by measuring the pH of the unaged solution then aging the solution for 16 hours in an open 150 ml glass beaker placed in a chemical fume hood at room temperature. After 16 hours the pH of the aged solution is taken and the pH drop determined.

Table 4c summarizes the results of the small beaker aging test for potential bath stabilizing agents with a pKa in the 10–13 range with and without the optional metal chelating agent added to the solution. If a bath stabilizing agent has more than one pKa associated with it, then only the pKa in the 10–13 range is shown in Table 4c. The pH drop comparison was done by measuring the pH of the solution aged in a sealed poly bottle and compare it to the same solution aged in an uncovered 100 ml small beaker for 20 hours at room temperature.

All potential bath stabilizing agents were obtained from either Aldrich or the J. T. Baker Division of Mallinckrodt Baker, Inc. The 2-Hydroxypyridine and 4-hydroxypyridine used was purchased from Aldrich and used without further purification.

TABLE 4a

20 Hour Uncovered Small Beaker Aging Test

| Solution | Bath Stabilizing Agent Used | Conc. of Bath Stabilizing Agent (wt. %) | pKa of Bath Stabilizing Agent Used (at 25° C.) | Amount of Bath Stabilizing Agent Added (grams) | Amount 24.85% TMAH Added to Adjust pH (grams) | Freshly Made Solution pH | pH Drop After Aging in a Sealed Poly Bottle* | PH Drop After Aging 20 Hours in Open Beaker |
|---|---|---|---|---|---|---|---|---|
| K1 | None | 0 | | | | 11.78 | no | Ave. = 0.78 |
| K2 | Acetone Oxime | 2.8 | 12.2 | 6.01 | 6.18 | 11.80 | slight | 0.50 |
| K3 | Acetone Oxime | 5.5 | 12.2 | 12.06 | 5.14 | 11.78 | slight | 0.39 |
| K4 | Salicyl-aldoxime | 2.5 | 12.11 | 6.00 | 32.77 | 11.78 | no | 0.28 |
| K5 | 5-Sulfo-salicylic Acid | 2.7 | 12.00 | 6.07 | 20.70 | 11.80 | no | 0.17 |
| K6 | Resorcinol | 2.5 | 12.32 | 6.02 | 32.29 | 11.63 | no | 0.07 |
| K7 | Resorcinol | 8.5 | 12.32 | 35.10 | 177.75 | 11.83 | no | 0.05 (incr.)** |
| K8 | 2-Methyl-resorcinol | 2.6 | 11.64 | 6.02 | 22.41 | 11.78 | slight | 0.13 |
| K9 | 2-Methyl-resorcinol | 5.5 (not fully dissolved) | 11.64 | | | | | |
| K10 | Orcinol | 2.7 | ~11–12 (estimated) | 6.40 | 30.66 | 11.81 | slight | 0.11 |
| K11 | Proline | 2.9 | 10.96 | 6.40 | 17.62 | 11.87 | no | 0.77 |
| K12 | 2-Methyl-1,5-pentane-diamine | 3.1 | 11.2 | 6.40 | 0 | 12.24 | no | 0.56 |
| K13 | Piperidine | 3.1 | 11.12 | 6.40 | 0 | 12.41 | no | 0.74 |
| K14 | Pyrrolidine | 3.1 | 11.31 | 6.40 | 0 | 12.49 | no | 0.50 |
| K15 | 4-Methyl-piperidine | 3.1 | 11.23 | 6.40 | 0 | 12.36 | no | 0.97 |
| K16 | Saccharin | 2.7 | 11.68 | 6.00 | 12.25 | 11.80 | no | 0.64 |
| K17 | 4-hydroxy-pyridine | 0.10 | 11.09 | 0.21 | 0.99 | 11.94 | no | 0.66 |
| K18 | 4-hydroxy-pyridine | 2.7 | 11.09 | 6.02 | 18.96 | 11.80 | no | 0.14 |
| K19 | 4-hydroxy-pyridine | 6.0 | 11.09 | 15.90 | 49.64 | 11.82 | no | 0.06 |
| K20 | 4-hydroxy-pyridine | 9.0 | 11.09 | 28.30 | 87.30 | 11.84 | no | 0.03 |
| K21 | 4-hydroxy-pyridine | 12.5 | 11.09 | 50.00 | 149.09 | 11.82 | no | 0 |
| K22 | 2-Hydroxy-pyridine | 0.10 | 11.62 | 0.21 | 0.66 | 11.89 | no | 0.61 |
| K23 | 2-Hydroxy-pyridine | 0.97 | 11.62 | 2.01 | 4.11 | 11.82 | no | 0.19 |
| K24 | 2-Hydroxy-pyridine | 1.4 | 11.62 | 3.01 | 5.78 | 11.82 | no | 0.15 |
| K25 | 2-Hydroxy-pyridine | 2.8 | 11.62 | 6.02 | 11.04 | 11.79 | no | 0.09 |
| K26 | 2-Hydroxy-pyridine | 4.0 | 11.62 | 9.03 | 16.45 | 11.82 | no | 0.05 |
| K27 | 2-Hydroxy-pyridine | 5.0 | 11.62 | 11.70 | 21.10 | 11.82 | no | 0.04 |
| K28 | 2-Hydroxy-pyridine | 6.0 | 11.62 | 14.50 | 26.11 | 11.83 | no | 0.03 |
| K29 | 2-Hydroxy-pyridine | 9.0 | 11.62 | 23.80 | 39.59 | 11.82 | no | 0.02 |
| K30 | 2-Hydroxy-pyridine | 12.2 | 11.62 | 35.60 | 56.98 | 11.83 | no | 0 |
| K31 | 2-Hydroxy-pyridine | 15.0 | 11.62 | 50.00 | 83.32 | 11.90 | no | 0 |
| K32 | Benzimid-azole | <3 (saturated) | 12.3 | | | 11.8 | no | 0.5 |
| K33 | Cyanuric Acid | ~1.5 (insoluble#) | 11.10 | | | | | |
| K34 | Dibutyl-amine | ~3 (insoluble#) | 11.25 | | | | | |
| K35 | Dimethyl-glyoxime | ~3 (insoluble#) | ~12 (estimated) | | | | | |
| K36 | Acetamidine | ~3 (insoluble#) | 12.4 | | | | | |

TABLE 4a-continued

20 Hour Uncovered Small Beaker Aging Test

| Solution | Bath Stabilizing Agent Used | Conc. of Bath Stabilizing Agent (wt. %) | pKa of Bath Stabilizing Agent Used (at 25° C.) | Amount of Bath Stabilizing Agent Added (grams) | Amount 24.85% TMAH Added to Adjust pH (grams) | Freshly Made Solution pH | pH Drop After Aging in a Sealed Poly Bottle* | PH Drop After Aging 20 Hours in Open Beaker |
|---|---|---|---|---|---|---|---|---|
| K37 | 2-Methyl-piperidine | ~3 (insoluble#) | 10.95 | | | | | |
| K38 | 3-Methyl-piperidine | ~3 (insoluble#) | 11.07 | | | | | |
| K39 | 4-Hydroxy-piperidine | ~3 (insoluble#) | ~11 (estimated) | | | | | |

*Any pH drop noted in the sealed poly bottle is likely due to oxidation of the buffer and was monitored over the course of several days. A "slight" pH drop rating corresponds to <0.10 pH units, which may be related to pH standardization errors.
**pH increased by 0.05, which would be expected as water evaporated off (typically, about 10 wt. % water was lost due to evaporation during uncovered beaker aging).
Insoluble despite addition of 25% aqueous TMAH to achieve pH ~12.

TABLE 4b

16 Hour Uncovered Small Beaker Aging Test

| Solution | Bath Stabilizing Agent Used | Conc. Of Bath Stabilizing Agent (as wt. % Carbonate) | pKa of Bath Stabilizing Agent Used (at 25° C.) | Freshly Made Solution pH | pH After Aging 16 Hours | pH Drop After Aging 16 Hours in Open Beaker |
|---|---|---|---|---|---|---|
| K1 | None | 0 | | 11.77 | 11.19 | 0.58 |
| K40 | TMA Carbonate | 0.67 | 10.33 | 11.76 | 11.34 | 0.42 |

Referring to Table 4a and Table 4b above, it is clear that not all bath stabilizing agents with a pKa in the 10–13 range would be effective in stabilizing these aqueous solutions against changes in pH. It is apparent that the best bath stabilizing agents are those that are NOT selected from the following: (a) reducing agents that could be easily oxidized by exposure to the air, (b) have a low boiling point such that the stabilizing agent would evaporate during exposure to the air, (c) have a solubility of less than 0.5 wt. % in aqueous alkaline solution. It is also apparent that choosing a bath stabilizing agent with a pKa as low as 10.3 is still useful for buffering a solution at a pH of about 11.8. Table 4a also clearly demonstrates that as the concentration of the bath stabilizing agent is increased the pH stability of the formulations are increased.

(TMAH), 0.11 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 0.14 weight percent (calculated as % $SiO_2$) tetramethylammonium silicate (TMAS) and 18.5 weight percent hydroxylamine (remainder of this solution being made up with de-ionized water) and has a pH of about 11.95 at 25.0° C.

Stabilized solutions were prepared by adding a bath stabilizing agent to 200.0 g of the above stock solution and adjusting the pH back to about 11.95 with 24.85% TMAH. Table 5 summarizes the results of the small beaker aging test for bath stabilizing agents with a pKa in the 10–13 range. If TABLE 4c 20 Hour Uncovered Small Beaker Aging Test

| Solution | Bath Stabilizing Agent Used | Conc. of Bath Stabilizing Agent (wt. %) | pKa of Bath Stabilizing Agent Used (at 25° C.) | Metal Chelating Agent Added? | Freshly Made Solution pH | pH After Aging 20 Hours | pH Drop After Aging 20 Hours in Open Beaker |
|---|---|---|---|---|---|---|---|
| K1 | None | 0 | | YES | 11.79 | 10.97 | 0.82 |
| K41 | 2-Hydroxy-pyridine | 5.0 | 11.62 | YES | 11.90 | 11.85 | 0.05 |
| K42 | 2-Hydroxy-pyridine | 5.0 | 11.62 | NO | 11.89 | 11.84 | 0.05 |

Referring to Table 4c, it is apparent that the presence of a metal chelating agent is optional and has no effect on the pH stability of the solution.

Example 5

Aqueous, unstabilized stock solution "L1" was prepared with 0.79 weight percent tetramethylammonium hydroxide a bath stabilizing agent has more than one pKa associated with it, then only the pKa in the 10–13 range is shown in Table 5. The pH drop comparison was done by measuring the pH of the solution aged in a sealed poly bottle to the same solution aged in an uncovered small beaker for 20 hours at room temperature.

TABLE 5

20 Hour Uncovered Small Beaker Aging Test

| Solution | Bath Stabilizing Agent Used | Conc. Of Bath Stabilizing Agent (wt. %) | pKa of Bath Stabilizing Agent Used (at 25° C.) | Amount of Bath Stabilizing Agent Added (grams) | Amount 24.85% TMAH Added to Adjust pH (grams) | Freshly Made Solution pH | pH Drop After Aging in a Sealed Poly Bottle* | pH Drop After Aging 20 Hours in Open Beaker |
|---|---|---|---|---|---|---|---|---|
| L1 | None | 0 | | | | 11.95 | no | Ave. = 1.84 |
| L2 | 2-Hydroxy-pyridine | 5.0 | 11.62 | 11.70 | 23.05 | 11.96 | no | 0.28 |
| L3 | 2-Hydroxy-pyridine | 11.2 | 11.62 | 32.73 | 58.39 | 11.95 | no | 0.11 |
| L4 | 2-Hydroxy-pyridine | 16.6 | 11.62 | 58.03 | 90.99 | 11.94 | no | 0.08 |
| L5 | 2-Hydroxy-pyridine | 22.1 | 11.62 | 95.00 | 134.29 | 11.94 | no | 0.05 |

*Any pH drop noted in the sealed poly bottle is likely due to oxidation of the buffer and was monitored over the course of several days. A "slight" pH drop rating corresponds to <0.10 pH units, which may be related to pH standardization errors.

Referring to Table 5 above, the unbuffered aqueous, hydroxylamine-containing formulation had a significant change in pH after aging. The addition of a bath stabilizing agent to the aqueous, hydroxylamine-containing solution dramatically improved the pH stability of the formulation. The table also clearly demonstrates that as the concentration of the bath stabilizing agent is increased the pH stability of the formulations are increased. Also, by extrapolation of the data in Table 5, a minimum concentration of about 31–35 wt. % 2-hydroxypyridine would be required to eliminate any pH drop under these test conditions. However, the actual amount required may be greater if the solution's pH stabilization behaves in an exponential rather than linear manner and may require as much as 50 wt. % 2-hydroxypyridine to eliminate any pH drop under these test conditions.

Example 6

Aqueous, stabilized solution "M1" was prepared with 3.0 weight percent of the bath stabilizing agent piperidine, 0.06 weight percent of the non-ionic surfactant Surfynol-465 (a product of Air Products and Chemicals, Inc.), 0.12 weight percent (calculated as % $SiO_2$) tetramethylammonium silicate (TMAS), 5.0 weight percent glycerol and the pH adjusted to about 11.77 at 25.0° C. by adding 0.95 weight percent trans-(1,2-cyclohexylenedinitrilo)tetraacetic acid (CyDTA) with the remainder of this solution being made up with de-ionized water.

Aqueous, stabilized solution "M2" was prepared with 3.0 weight percent of the bath stabilizing agent pyrrolidine, 0.06 weight percent of the non-ionic surfactant Surfynol-465 (a product of Air Products and Chemicals, Inc.), 0.12 weight percent (calculated as % $SiO_2$) tetramethylammonium silicate (TMAS), 5.0 weight percent glycerol and the pH adjusted to about 11.79 at 25.0° C. by adding 1.1 weight percent (ethylenedinitrilo)tetraacetic acid (EDTA), with the remainder of this solution being made up with de-ionized water.

Aqueous, stabilized solution "M3" was prepared with 3.0 weight percent of the bath stabilizing agent 2-methyl-1,5-pentanediamine, 0.06 weight percent of the non-ionic surfactant Surfynol-465 (a product of Air Products and Chemicals, Inc.), 0.12 weight percent (calculated as % $SiO_2$) tetramethylammonium silicate (TMAS), 5.1 weight percent glycerol and the pH adjusted to about 11.81 at 25.0° C. by adding 0.14 weight percent (ethylenedinitrilo)tetraacetic acid (EDTA), with the remainder of this solution being made up with de-ionized water.

Aqueous, stabilized solution "M4" was prepared with 5.9 weight percent of the bath stabilizing agent 2-methyl-1,5-pentanediamine, 0.06 weight percent of the non-ionic surfactant Surfynol-465 (a product of Air Products and Chemicals, Inc.), 0.12 weight percent (calculated as % $SiO_2$) tetramethylammonium silicate (TMAS), 4.9 weight percent glycerol and the pH adjusted to about 11.79 at 25.0° C. by adding 0.44 weight percent (ethylenedinitrilo)tetraacetic acid (EDTA), with the remainder of this solution being made up with de-ionized water.

Table 6 summarizes the results of the small beaker aging test for bath stabilizing agents with a pKa in the 10–13 range. If a bath stabilizing agent has more than one pKa associated with it, then only the pKa in the 10–13 range is shown in Table 6. The pH drop comparison was done by measuring the pH of the solution aged in a sealed poly bottle to the same solution aged in an uncovered small beaker for 20 hours at room temperature.

TABLE 6

20 Hour Uncovered Small Beaker Aging Test

| Solution | Bath Stabilizing Agent Used | Conc. of Bath Stabilizing Agent (wt. %) | pKa of Bath Stabilizing Agent Used (at 25° C.) | Freshly Made Solution pH | pH Drop After Aging 20 Hours in Open Beaker |
|---|---|---|---|---|---|
| K1 | None | 0 | | 11.78 | Ave. = 0.78 |
| M1 | Piperidine | 3.0 | 11.12 | 11.77 | 0.66 |
| M2 | Pyrrolidine | 3.0 | 11.31 | 11.79 | 0.46 |

TABLE 6-continued

20 Hour Uncovered Small Beaker Aging Test

| Solution | Bath Stabilizing Agent Used | Conc. of Bath Stabilizing Agent (wt. %) | pKa of Bath Stabilizing Agent Used (at 25° C.) | Freshly Made Solution pH | pH Drop After Aging 20 Hours in Open Beaker |
|---|---|---|---|---|---|
| M3 | 2-methyl-1,5-pentanediamine | 3.0 | 11.2 | 11.81 | 0.41 |
| M4 | 2-methyl-1,5-pentanediamine | 5.9 | 11.2 | 11.79 | 0.29 |

Referring to Table 6 above, there is a clear benefit to adding an alkaline bath stabilizing agent to these aqueous formulations for reducing the pH drop associated with their exposure to the air over time. The table also clearly demonstrates that as the concentration of the bath stabilizing agent is increased the pH stability of the formulations are increased. The advantage in using an alkaline bath stabilizing agent is that since TMAH has no measurable pKa (it is fully dissociated in water) it does not stabilize the solution that it is in. An alkaline bath stabilizing agent will achieve the desired pH and also afford bath pH stability at the same time with one less component added to the formulation. Another advantage of using an alkaline bath stabilizing agent is that it may be combined with one or more additional bath stabilizing agents to afford the maximum bath pH stability for a formulation.

Example 7

Aqueous, stabilized solution "N1" was prepared with 3.0 weight percent tetramethylammonium hydroxide (TMAH), 0.1 weight percent trans-(1,2-cyclohexylenedinitrilo) tetraacetic acid (CyDTA), 0.06 weight percent of the non-ionic surfactant Surfynol-465 (a product of Air Products and Chemicals, Inc.), 0.21 weight percent (calculated as % $SiO_2$) tetramethylammonium silicate (TMAS), 9.0 weight percent glycerol and 2.8 weight percent of the bath stabilizing agent 5-sulfosalicylic acid (remainder of this solution being made up with de-ionized water) and has a pH of about 11.94 at 25.0° C.

Aqueous, stabilized solution "N2" was prepared by adding 2-hydroxypyridine to stock solution "K1" and adjusting the pH back to it's starting pH by adding additional 25 wt. % TMAH. Solution "N2" contains: 1.4 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.13 weight percent (calculated as % $SiO_2$) tetramethylammonium silicate (TMAS), 5.6 weight percent glycerol and 2.8 weight percent of the bath stabilizing agent 2-hydroxypyridine (remainder of this solution being made up with de-ionized water) and has a pH of about 11.80 at 25.0° C.

Aqueous, stabilized solution "N3" was prepared by adding 4-hydroxypyridine to stock solution "K1" and adjusting the pH back to it's starting pH by adding additional 25 wt. % TMAH. Solution "N3" contains: 2.3 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.12 weight percent (calculated as % $SiO_2$) tetramethylammonium silicate (TMAS), 5.4 weight percent glycerol and 2.7 weight percent of the bath stabilizing agent 4-hydroxypyridine (remainder of this solution being made up with de-ionized water) and has a pH of about 11.80 at 25.0° C.

Aqueous, stabilized solution "N4" was prepared by adding resorcinol to stock solution "K1" and adjusting the pH back to it's starting pH by adding additional 25 wt. % TMAH. Solution "N4" contains: 3.7 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.11 weight percent (calculated as % $SiO_2$) tetramethylammonium silicate (TMAS), 5.0 weight percent glycerol and 2.5 weight percent of the bath stabilizing agent resorcinol (remainder of this solution being made up with de-ionized water) and has a pH of about 11.78 at 25.0° C.

Aqueous, stabilized solution "N5" was prepared by adding 2-hydroxypyridine to stock solution "K1" and adjusting the pH back to it's starting pH by adding additional 25 wt. % TMAH. Solution "N5" contains: 2.9 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.11 weight percent (calculated as % $SiO_2$) tetramethylammonium silicate (TMAS), 5.0 weight percent glycerol and 6.0 weight percent of the bath stabilizing agent 2-hydroxypyridine (remainder of this solution being made up with de-ionized water) and has a pH of about 11.83 at 25.0° C.

Wafer sample #8 with 0.35 micron wide features and Aluminum-Copper raised lines capped with titanium-nitride, were previously prepared as follows: (a) a coating of spin-on-glass was applied to a silicon wafer and cured (b) a titanium adhesion layer was applied (c) a titanium nitride layer was deposited (d) metallization with an aluminum-1% copper alloy (e) a titanium nitride capping layer was deposited (f) lithographic patterning using a photoresist material (g) pattern transfer using reactive ion etching and (h) oxygen plasma ashing to remove organic photoresist residues, but leaving mainly inorganic residues behind. The residues formed on the aluminum sidewalls of this wafer were easily cleaned by the aqueous formulations above in less than 5 minutes at 25° C. Therefore, this wafer proved useful for comparing aluminum metal sidewall etch-rates after an extended treatment time.

A section from wafer sample #8 was treated in one of the solutions above for 40 minutes (with the exception of solution N1, which was 10 minutes) at either 25, 30, 35 or 40° C. Once the treatment was completed it was removed, rinsed with de-ionized water and dried with pressurized nitrogen gas. Then the samples were cross-sectioned perpendicular to the direction of a parallel line pattern, Pd—Au coated and then inspected in a Field Emission Scanning Electron Microscope (FE-SEM). The FE-SEM inspection was used to measure the amount of aluminum metal sidewall loss that had occurred during the treatment and calculate an aluminum metal sidewall etch-rate for each temperature. The results are shown in Tables 7a and 7b below.

2-hydroxypyridine and 4-hydroxypyridine appear to be acting as aluminum corrosion inhibitors in these formulations and can be seen as the concentration is increased as shown in Table's 7a and 7b. If necessary, the amount of glycerol may be decreased to raise the aluminum metal etch-rate and enable residue removal in shorter treatment times.

TABLE 7a

Al-1% Cu Metal Sidewall Etch-Rate Comparison for Wafer #8 Determined by FE-SEM

| Solution | Bath Stabilizing Agent Added | Amount of Bath Stabilizing Agent Added (Wt. %) | Solution pH | Al/Cu Metal Sidewall Etch-Rate at 25° C. (Å/min.) | Al/Cu Metal Sidewall Etch-Rate at 30° C. (Å/min.) | Al/Cu Metal Sidewall Etch-Rate at 35° C. (Å/min.) | Al/Cu Metal Sidewall Etch-Rate at 40° C. (Å/min.) | Al/Cu Metal Sidewall Etch-Rate at 50° C. (Å/min.) |
|---|---|---|---|---|---|---|---|---|
| N1 | 5-Sulfo-salicylic Acid | 2.8 | 11.94 | 0* | 5* | 10* | 35* | |
| K1 | None | 0 | 11.78 | 1 | 1 | 1 | 1 | |
| K2 | Acetone Oxime | 2.8 | 11.81 | | | | 26 | |
| N4 | Resorcinol | 2.5 | 11.78 | | | | >34 (Al lines removed) | |
| N2 | 2-Hydroxy-pyridine | 2.8 | 11.80 | 0 | 0 | 2 | 4 | |
| K41 | 2-Hydroxy-pyridine | 5.0 | 11.90 | 0 | 0 | 1 | 3 | 9 |
| N5 | 2-Hydroxy-pyridine | 6.0 | 11.83 | | | | 0 | |
| N3 | 4-Hydroxy-pyridine | 2.7 | 11.80 | 0 | 0 | 2 | 4 | |

*Etch-rate is based on a 10 minute treatment since a 40 minute treatment completely removed the aluminum lines from the wafer at higher temperatures.

TABLE 7b

FE-SEM Cleaning Evaluation Results for Wafer #8 at 40° C.

| Solution | Bath Stabilizing Agent Added | Amount of Bath Stabilizing Agent Added (Wt. %) | pH at 25° C. | Al—Cu Metal Sidewall Etch-Rate at 40° C. (Å/min.) | Wafer Sample Process Time (min.) | Amount of Ash Residue Removed (%) | Amount of Aluminum Metal Etching |
|---|---|---|---|---|---|---|---|
| K1 | None | | 11.78 | 1 | 20 | 100 | None |
| N2 | 2-Hydroxy-pyridine | 2.8 | 11.80 | 4 | 20 | 100 | Slight |
| N5 | 2-Hydroxy-pyridine | 6.0 | 11.83 | 0 | 20 | 98 | None |
| N5 | 2-Hydroxy-pyridine | 6.0 | 11.83 | 0 | 40 | 100 | None |

Referring to Table 7a above, solution "N1" contains more TMAS and glycerol than solutions K41 and N2–N5 shown above so as to help compensate for the added aggressiveness towards aluminum metal caused by the bath stabilizing agent 5-sulfosalicylic acid (due to metal complexing) at 25° C. However, the aluminum etch-rates increase markedly at higher temperatures for solution "N1". Solution "N4" utilizes the bath stabilizing agent resorcinol, which is also known to be an effective metal complexing agent and also imparts additional aggressiveness to the formulation towards aluminum metal. While the addition of more TMAS would help to reduce the aluminum etch-rate the "process time window" would be reduced as shown below in Example 8. The addition of the bath stabilizing agents 2-hydroxypyridine or 4-hydroxypyridine (supplied by Aldrich) to the formulation is unique in that the aluminum etch-rate appears to be reduced while stabilizing the solution to prevent a change in pH during use. Therefore, the Example 8

Sections from wafer sample #8 were treated for various times in each of four solutions, removed, rinsed with de-ionized water, dried with pressurized nitrogen gas, Pd—Au coated and then inspected in a Field Emission Scanning Electron Microscope (FE-SEM). The FE-SEM inspection was used to determine the amount of residue removal and aluminum metal sidewall etching that had occurred during the treatments. All solutions outlined in the table below were capable of cleaning wafer sample #8 in about 5 minutes at room temperature. In cases where no treatment data was available for a particular time, the aluminum metal sidewall etch rates determined above in Table 7a were used to calculate the amount of etching that would occur at that particular time. Based on this calculation, a determination as to whether an acceptable amount of etching would be expected was made and assigned for that particular treatment time. The results are shown in Table 8a below.

TABLE 8a

Process Time Window Comparison for Wafer #8 at 40° C.

Solution Cleaning/Etching Performance by FE-SEM (Pass/Fail)

| Process Time at 40° C. (min.) | K1 (No Stabilizer Added) | N1 (2.8 wt. % 5-Sulfosalicylic Acid Stabilizer Added) | K41 (5.0 wt % 2-Hydroxy-pyridine Stabilizer Added) | N3 (2.7 wt % 4-Hydroxy-pyridine Stabilizer Added) |
|---|---|---|---|---|
| 5 | PASS | PASS* | PASS | PASS* |
| 10 | PASS | FAIL (Clean, but had Excessive Etching) | PASS | PASS* |
| 15 | PASS* | FAIL** | PASS* | PASS* |
| 20 | PASS* | FAIL** | PASS | PASS* |
| 25 | PASS* | FAIL** | PASS* | PASS* |
| 30 | PASS* | FAIL** | PASS | FAIL** |
| 35 | PASS* | FAIL** | FAIL** | FAIL** |
| 40 | PASS | FAIL** | FAIL (Clean, but had Excessive Etching) | FAIL (Clean, but had Excessive Etching) |

*Based on the aluminum sidewall etch-rate known for this solution the sample would be clean with an acceptable amount of aluminum sidewall etching.
**Based on the aluminum sidewall etch-rate known for this solution the sample would be clean with an unacceptable amount of aluminum sidewall etching.

TABLE 8b

Process Temperature Window Comparison for Wafer #8a for 20 Minute Treatment Time Solution % Cleaning/Etching Performance by FE-SEM

| Process Temp. Used for 20 min. Treatment (° C.) | K1 (No Stabilizer Added) | N1 (2.8 wt. % 5-Sulfosalicylic Acid Stabilizer Added) | N2 (2.8 wt. % 2-Hydroxy-pyridine Stabilizer Added) | K41 (5.0 wt. % 2-Hydroxy-pyridine Stabilizer Added) | N3 (2.7 wt. % 4-Hydroxy-pyridine Stabilizer Added) |
|---|---|---|---|---|---|
| 25 | | 100%/slight | 90%/none | 90%/none | 85%/none |
| 30 | | 100%/slight | 95%/none | 99%/none | 90%/none |
| 35 | | | 99%/none | 100%/none | 98%/none |
| 40 | 100%/none | 100%/light* | 100%/none | 100%/none | 100%/none |

*10 minute treatment.

Referring to Table 8a above, clearly there is an advantage in using either 2-hydroxypyridine or 4-hydroxypyridine as a bath stabilizing agent added to solutions similar to "K1" to maintain a large cleaning process window. A large process time window is desirable for flexibility in the manufacturing process. Referring to Table 8b above, there is a clear advantage in adding the bath stabilizing agent 2-hydroxypyridine or 4-hydroxypyridine in terms of the metal corrosion that occurs during treatments at various process temperatures.

Example 9

Wafer sample's #7 and #9 with 0.3–0.5 micron wide by 0.5 micron deep holes (vias) through dielectric and titanium nitride layers exposing aluminum-copper alloy metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic residues behind, were used to evaluate the performance of the solutions. A sample from wafer #7 and #9 was placed in solution's "L1" and "L2" at 45° C. for 10 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the metal features. The results are shown in Table 9.

TABLE 9

FE-SEM Cleaning Evaluation Results for Hydroxylamine-Based Solutions

| Solution | Bath Stabilizing Agent Added | Amount of Bath Stabilizing Agent Added (Wt. %) | Wafer Sample Number | Wafer Sample Process Conditions (min./° C.) | Amount of Ash Residue Removed (%) | Amount of Aluminum Metal Etching |
|---|---|---|---|---|---|---|
| L1 | None | 0 | 7 | 10/45 | 100 | Slight |
| L2 | 2-Hydroxy-pyridine | 5.0 | 7 | 10/45 | 100 | Slight |
| L1 | None | 0 | 9 | 10/45 | 100 | Slight |
| L2 | 2-Hydroxy-pyridine | 5.0 | 9 | 10/45 | 100 | Slight |

Referring to Table 9 above, it is apparent that the addition of a bath stabilizing agent to a aqueous, hydroxylamine-containing solution has little effect on the cleaning performance of the formulation, while significantly decreasing the pH change with time that occurs with an aqueous, hydroxylamine-containing formulation (see Table 5 above).

Example 10

Aqueous, stabilized solution "N6" was prepared with 1.5 weight percent tetramethylammonium hydroxide (TMAH), 0.1 weight percent trans-(1,2-cyclohexylenedinitrilo) tetraacetic acid (CyDTA), 0.06 weight percent of the non-ionic surfactant Surfynol-465 (a product of Air Products and Chemicals, Inc.), 0.13 weight percent (calculated as % $SiO_2$) tetramethylammonium silicate (TMAS), 5.5 weight percent glycerol and 2.8 weight percent of the bath stabilizing agent 2-hydroxypyridine (remainder of this solution being made up with de-ionized water) and has a pH of about 11.85 at 25.0° C.

Comparative uncovered 4 L baths with magnetic stirring at a rate of 150 rpm were set up in a chemical fume hood with an air-flow rate of about 100 feet per minute (FPM) over the baths. The temperature of the baths was maintained by use of programmable digital hot plates with a bath temperature monitoring probe. The weight of the solution added to the 4 L beaker is known and the total weight of the solution, beaker and stir-bar is measured before and after aging the baths at 40° C. Samples were processed both before and after the 24 hour aged bath is reconstituted with de-ionized water to adjust for evaporative water loss. Sections of wafer sample's #8 and #8a were placed in each 24 hour/40° C. aged 4 L bath solution prior to stopping the aging test, removed, rinsed with de-ionized water and dried with pressurized nitrogen gas. Next, after 24.5 hours aging, the total weight of the solution, beaker and stir-bar is taken and the total water loss calculated for bath re-constitution. A sample of the 24.5 hour aged 4 L bath solution is then taken and reconstituted with de-ionized water by weight. Next, the solution is heated back up to 40° C. with stirring for processing for 20 minutes, removed, rinsed with de-ionized water then dried with pressurized nitrogen gas. After drying, the samples were inspected on a Field Emission Scanning Electron Microscope (FE-SEM) to determine the extent of cleaning and/or corrosion of the metal features. The bath aging results are shown below in Table 10. Note: wafer sample #8a was prepared in the same way as wafer sample #8 with the exception that changes were made in the wafer etch/ash procedure that made the residues more difficult to remove than wafer sample #8. A minimum cleaning temperature of about 40° C. was required by the aqueous solutions shown in Table 10 for wafer sample #8a. A minimum cleaning temperature of about 25° C. was required for wafer sample #8.

TABLE 10

4-Liter Uncovered Bath FE-SEM Cleaning Comparison of Unstabilized to Stabilized Solutions

| Solution | Bath Stabilizing Agent Added | Amount of Bath Stabilizing Agent Added (Wt. %) | Wafer Sample Number | Wafer Sample Process Conditions (min./° C.) | Bath Aging Time (Hours) | Residue Removed? (No DI Water Added) | Residue Removed? (Reconst. with DI Water) | pH (25° C., No DI water added) |
|---|---|---|---|---|---|---|---|---|
| K1 | None | 0 | 8 | 10/40 | 0 | YES | | 11.78 |
| K1 | None | 0 | 8 | 10/40 | 20 | NO (90% clean) | NO | 11.57 |
| K1 | None | 0 | 8 | 10/40 | 24 | NO | | 11.50 (11.47 with water added) |
| K1 | None | 0 | 8a | 10/40 | 0 | YES | | |
| K1 | None | 0 | 8a | 10/40 | <8 | NO | | |
| N6 | 2-Hydroxy-pyridine | 2.8 | 8a | 20/40 | 0 | YES | | 11.85 |
| N6 | 2-Hydroxy-pyridine | 2.8 | 8a | 20/40 | 24 | NO (98% clean) | YES* | 11.82 (11.81 with water added) |
| K41 | 2-Hydroxy-pyridine | 5.0 | 8 | 20/40 | 0 | YES | | 11.90 |
| K41 | 2-Hydroxy-pyridine | 5.0 | 8 | 20/40 | 24 | YES | | 11.89 |
| K41 | 2-Hydroxy-pyridine | 5.0 | 8a | 20/40 | 0 | YES | | 11.90 |
| K41 | 2-Hydroxy-pyridine | 5.0 | 8a | 20/40 | 24 | YES | YES* | 11.89 (11.88 with water added) |
| K42 (No metal chelating agent added) | 2-Hydroxy-pyridine | 5.0 | 8 | 20/40 | 0 | YES | | 11.89 |

TABLE 10-continued

4-Liter Uncovered Bath FE-SEM Cleaning Comparison of Unstabilized to Stabilized Solutions

| Solution | Bath Stabilizing Agent Added | Amount of Bath Stabilizing Agent Added (Wt. %) | Wafer Sample Number | Wafer Sample Process Conditions (min./° C.) | Bath Aging Time (Hours) | Residue Removed? (No DI Water Added) | Residue Removed? (Reconst. with DI Water) | pH (25° C., No DI water added) |
|---|---|---|---|---|---|---|---|---|
| K42 (No metal chelating agent added) | 2-Hydroxy-pyridine | 5.0 | 8 | 20/40 | 24 | YES | | 11.87 |
| K42 (No metal chelating agent added) | 2-Hydroxy-pyridine | 5.0 | 8a | 20/40 | 24 | YES | YES* | 11.87 (11.87 with water added) |

*Solution bath aged 24.5 hours at 40° C.

Referring to Table 10, the data shows the benefits of adding a bath stabilizing agent to a solution to extend it's cleaning bath-life to greater than 24 hours. The data also clearly indicates that the efficiency in cleaning (without needing to reconstitute the bath with de-ionized water after aging 24 hours) and pH control increases with the concentration of the bath stabilizing agent. Additionally, the data indicates that the addition of an optional metal chelating agent is not necessary to effectively clean residues from the wafer samples before or after bath aging.

Example 11

Aqueous, stabilized solution "O1" was prepared with 2.03 weight percent tetramethylammonium hydroxide (TMAH), 1.56 weight percent stable hydrogen peroxide and 0.14 weight percent (calculated as % $SiO_2$) tetramethylammonium silicate (TMAS) with the remainder of this solution being made up with de-ionized water.

Aqueous, stabilized solution "O2" was prepared with 2.13 weight percent tetramethylammonium hydroxide (TMAH), 1.55 weight percent stable hydrogen peroxide, 0.11 weight percent trans-(1,2-cyclohexylenedinitrilo)tetraacetic acid (CyDTA) and 0.14 weight percent (calculated as % $SiO_2$) tetramethylammonium silicate (TMAS) with the remainder of this solution being made up with de-ionized water.

Aqueous, stabilized solution "O3" was prepared by combining with 2.02 weight percent tetramethylammonium hydroxide (TMAH), 0.12 weight percent diethylenetriaminepenta(methylenephosphonic acid) (DETAP), 1.58 weight percent stable hydrogen peroxide and 0.14 weight percent (calculated as % $SiO_2$) tetramethylammonium silicate (TMAS) with the remainder of this solution being made up with de-ionized water and has a pH of about 11.50 at 22.5° C.

A sample from wafer #7 was placed in each of solutions "O1"–"O3" at 22–35° C. for 20 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the metal features. A comparison of freshly-prepared solutions to solutions aged at room temperature in sealed poly bottles was done. The results are shown in Tables 11a and 11b.

TABLE 11a

FE-SEM Cleaning Evaluation Results for Hydrogen Peroxide-Based Solutions

| | | | | | Freshly Prepared Solution | | | Solution Aged in a sealed Bottle for approx. 2 Months at Room Temp. | | |
|---|---|---|---|---|---|---|---|---|---|---|
| Solution | Metal Chelating Agent Added | Wafer Sample Number | Wafer Sample Process Conditions (min./° C.) | Unaged pH/ % $H_2O_2$ (22.5° C.) | Amount of Ash Residue Removed (%) | Amount of Aluminum Metal Etching | Aged pH/ % $H_2O_2$ (22.5° C.) | Amount of Ash Residue Removed (%) | Amount of Aluminum Metal Etching |
| O1 | None | 7 | 20/22 | 11.5/1.5 | 99* | None | —/0.5** | | |
| O2 | CyDTA | 7 | 20/35 | 11.6/1.5 | 100 | None | 11.7/1.4 | 100 | Very Slight |
| O3 | DETAP | 7 | 20/35 | 11.5/1.5 | 100 | None | 11.5/1.4 | 100 | None |

*100% cleaning is expected for a 20 min./35° C. treatment.
**Aged 1 month at room temperature in a sealed poly bottle.

TABLE 11b

FE-SEM Cleaning Evaluation Results for Hydrogen Peroxide-Based Solutions

| | | | Wafer | Solutions Aged for 13 Months | | |
|---|---|---|---|---|---|---|
| Solution | Metal Chelating Agent Added | Wafer Sample Number | Sample Process Conditions (min./° C.) | Aged pH/ % $H_2O_2$ (22.5° C.) | Amount of Ash Residue Removed (%) | Amount of Aluminum Metal Etching |
| O3 | DETAP | 7 | 20/35 | 11.8/1.1 | 100 | Light |

Referring to Tables 11a and 11b above, it is apparent that the addition of a chelating agent is optional for freshly-prepared solutions. However, if the solutions are to be pre-mixed with hydrogen peroxide added then the addition of CyDTA or a phosphonic acid chelating agent has a significant influence on the solution's stability as can be seen by the hydrogen peroxide concentration. Since hydrogen peroxide is slightly acidic, the pH will increase due to trace-metal catalyzed decomposition of the hydrogen peroxide. Trace metals in hydrogen peroxide are known to increase the rate of decomposition and the presence of a metal chelating agent in the solution will drastically reduce the decomposition rate. However, the chelating agent must also be resistant to hydrogen peroxide decomposition. It is also apparent that DETAP is more stable to hydrogen peroxide than CyDTA based on the relative pH changes. While CyDTA increased in pH by 0.1 units in 2 months the DETAP did not increase in pH over the same period. Even after 13 months the DETAP-based solution "O3" only increased in pH by 0.3 units.

Example 12

Each of the solutions "O1"–"O3" were aged for up to 13 months at room temperature in a sealed poly bottle with a portion of each solution taken periodically for a hydrogen peroxide assay. A comparison of the amount of hydrogen peroxide remaining for the three solutions over time are shown below in Table 12.

which depends on a critical concentration in order for effective cleaning to occur. If the hydrogen peroxide decomposes below this critical concentration then two things will occur: (1) excessive corrosion of the aluminum metal will occur due to an increase in the pH of the solution (hydrogen peroxide is slightly acidic) and (2) the titanium-containing residues such as those found in wafer sample #7 will not be cleaned.

Example 13

Copper corrosion inhibitors were tested in aqueous, stabilized solution "A1" by adding 0.1 weight percent of the inhibitor for each test. Copper metal foil was cut into coupons with the coupon dimensions kept constant. The coupons were pre-cleaned to remove the surface oxide using hydrochloric acid followed by a de-ionized water rinse and dry. These copper foil coupons were then pre-weighed on an analytical balance. The capped bottles of test solutions were pre-heated at 65° C. for one-hour prior to adding the coupons. The heated solutions were removed from the oven and the coupons were then immediately added to the bottles containing the test solutions, re-capped and then placed back into the oven. After 24 hours in the oven, the coupons were removed, rinsed with de-ionized water and dried. The copper coupons were then weighed on an analytical balance and the resulting copper metal etch-rates calculated. The results are shown below in Table 13.

TABLE 12

Hydrogen Peroxide Decomposition With and Without Chelating Agent Added Over Time

| | Metal Chelating Agent Added | Wt. % Hydrogen Peroxide Remaining After Aging at Room Temp.: | | | | | |
|---|---|---|---|---|---|---|---|
| Solution | | 0 Months | 1 Months | 2 Months | 3 Months | 5 Months | 6 Months | 13 Months |
| O1 | None | 1.5 | 0.5 | | 0.2 | | | |
| O2 | CyDTA | 1.5 | 1.4 | | 1.2 | | 0.3 | |
| O3 | DETAP | 1.5 | | 1.4 | 1.3 | 1.2 | | 1.1 |

Referring to Table 12, it is apparent that the addition of CyDTA slows the decomposition rate of hydrogen peroxide over a period of several months. It is also apparent that the phosphonic complexing agent DETAP is superior to CyDTA over an extended period of time (more than 1 year) at room temperature in terms of slowing the hydrogen peroxide decomposition rate. While hydrogen peroxide does act as a bath "stabilizing" agent, its own long-term stability in the bottle to decomposition needs to be assured by the addition of an oxidation-resistant metal chelating agent. Hydrogen peroxide also acts as a "titanium residue removal enhancer",

TABLE 13

Copper Metal Corrosion Rate Comparison for Solution "A1" with Copper Corrosion Inhibitors Added

| Inhibitor Added | Copper Metal Etch-Rate (Angstroms/hour) |
|---|---|
| None | 200 |
| Benzotriazole | 140 |
| 5-Methylbenzotriazole | 30 |

TABLE 13-continued

Copper Metal Corrosion Rate Comparison for
Solution "A1" with Copper Corrosion Inhibitors Added

| Inhibitor Added | Copper Metal Etch-Rate (Angstroms/hour) |
| --- | --- |
| Benzotriazole-5-carboxylic acid | 170 |
| 5-Chlorobenzotriazole | 40 |
| 5-Nitrobenzotriazole | 80 |

Referring to Table 13, it is apparent that the addition of a copper corrosion inhibitor decreases the solution etch-rate on copper metal for a stabilized aqueous solution. This would minimize any unwanted copper etching that would occur for a solution of this type while still allowing the removal of copper-containing etch residues.

The invention has been described and illustrated with various illustrative embodiments thereof. It will be appreciated that these embodiments are not limiting and that various modifications and changes may be made without departing from the spirit and scope of the invention.

I claim:

1. A composition for stripping or cleaning integrated circuit substrates, comprising:
   (a) one or more metal ion-free bases in an amount sufficient to produce a pH of the composition of about 11 or greater;
   (b) a bath stabilizing effective amount of at least one bath stabilizing agent comprising at least one compound with at least one pKa in the range of 10 to 13;
   (c) water; and
   (d) from about 0.01% to about 5% by weight of the composition of a water-soluble metal ion-free silicate.

2. The composition of claim 1 wherein the metal ion-free bases are present in sufficient amounts to produce a pH of from about 11 to about 13.

3. The composition of claim 1 wherein the at least one bath stabilizing agent comprises at least one compound with at least one pKa in the range of 11 to 12.5.

4. The composition of claim 1 wherein the at least one bath stabilizing agent is selected from the group consisting of acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,6-hexanediamine, 1,8-octanediamine, 1,12-dodecanediamine, 1,3-diaminopentane and orcinol.

5. The composition of claim 1 wherein the at least one bath stabilizing agent is added to a concentration of from 0.1 to 50% by weight.

6. The composition of claim 1 wherein the at least one bath stabilizing agent comprises at least one compound selected from the group consisting of 2-hydroxypyridine, 4-hydroxypyridine, resorcinol and 2-methylresorcinol.

7. The composition of claim 1 wherein the composition further contains one or more chelating or complexing agents and the concentration of chelating or complexing agents is from about 0.01% to about 10% by weight.

8. The composition according to claim 7 wherein the bath stabilizing agent is hydrogen peroxide and the chelating or complexing agent is selected from the group consisting of (1,2-cyclohexylenedinitrilo)tetraacetic acid (CyDTA) and phosphonic acids.

9. The composition of claim 7 wherein the chelating or complexing agent is selected from the group consisting of aminocarboxylic acids and phosphonic acids.

10. The composition of claim 7 wherein the chelating or complexing agent is selected from the group consisting of (ethylenedinitrilo)tetraacetic acid, diethylenetriaminepentaacetic acid, triethylenetetraminehexaacetic acid, 1,3-diamino-2-hydroxypropane-N,N,N',N'-tetraacetic acid, N,N,N',N'-ethylenediaminetetra(methylenephosphonic acid), cis-1,2-cyclohexylenedinitrilo)tetraacetic acid, 1,5,9-triazacyclododecane-N,N',N"-tris(methylenephosphonic acid) (DOTRP), 1,4,7,10-tetraazacyclododecane-N,N',N",N"'-tetrakis(methylenephosphonic acid) (DOTP), nitrilotris(methylene) triphosphonic acid, diethylenetriaminepenta (methylenephosphonic acid), aminotri(methylenephosphonic acid), 1-hydroxyethylene-1,1-diphosphonic acid, bis(hexamethylene)triamine phosphonic acid, 1,4,7-triazacyclononane-N,N',N"-tris(methylenephosphonic acid (NOTP), ethylenediaminetetra (methylenephosphonic acid), 2-phosphonobutane-1,2,4-tricarboxylic acid and trans-(1,2-cyclohexylenedinitrilo) tetraacetic acid.

11. The composition of claim 1 further comprising one or more water-soluble organic co-solvents.

12. The composition of claim 11 wherein the concentration of water-soluble organic co-solvents is from about 0.1% to about 30% by weight.

13. The composition of claim 11 wherein said water-soluble organic co-solvent is selected from the group consisting of 1-hydroxyalkyl-2-pyrrolidinones alcohols and polyhydroxy compounds.

14. The composition of claim 11 wherein said water-soluble organic co-solvent is glycerol.

15. The composition of claim 1 further containing one or more water-soluble surfactants.

16. The compositions of claim 15 wherein the concentration of water-soluble surfactants is from about 0.01% to about 1% by weight.

17. The composition of claim 1 wherein the base is selected from the group consisting of hydroxides and organic amines.

18. The composition of claim 17 wherein the base is selected from the group consisting of quaternary ammonium hydroxides, ammonium hydroxides, and organic amines.

19. The composition of claim 1 wherein the base is selected from the group consisting of choline, tetrabutylammonium hydroxide, tetramethylammonium hydroxide, monomethyltriethanolammonium hydroxide, monomethyltriethylammonium hydroxide, tetraethylammonium hydroxide, tetrapropylammonium hydroxide, tetraethanolammonium hydroxide, 2-methyl-1,5-pentanediamine, 1,2-ethanediamine, 1,3-propanediamine, 1,4-butanediamine, 1,5-pentanediamine, 1,6-hexanadiamine, 1,7-heptanediamine, 1,8-octanediamine, 1,9-nonanediamine, 1,10-decanediamine, 1,11-undecanediamine, 1,12-dodecanediamine and 1,3-diaminopentane.

20. The composition of claim 1 wherein the water-soluble metal ion-free silicate is selected from the group consisting of ammonium silicates and quaternary ammonium silicates.

21. The composition of claim 1 wherein the water-soluble metal ion-free silicate is tetramethylammonium silicate.

22. The composition of claim 1 containing from about 0.1–25% by weight tetramethylammonium hydroxide and about 0.01–1% by weight of tetramethylammonium silicate.

23. The composition of claim 22 further containing from about 0.01–1% by weight trans-(1,2-cyolohexylenedinitrilo) tetraacetic acid.

24. The composition of claim 1 wherein the bath stabilizing agent is selected from the group consisting of acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine, 1,12-dodecanediamine, 1,3-diaminopentane, orcinol, hydrogen germanate, adenosine, cytosine, arginine, benzil-α-dioxime, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, diethylbiguanide, diguanide, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, 4-formyl-3-methoxypyridine, guanine, guanosine, 2-hydroxybenzaldehyde oxime, N-(hydroxyethyl) biguanide, 2-hydroxyquinoline, hypoxanthene, inosine, 5-iodohistamine, 2,2'-methylenebis(4-chlorophenol), 2-methyl-8-hydroxyquinoline, 4-methyl-8-hydroxyquinoline, 1-methylxanthine, phenylalanylarginine, silicic acid, sparteine, thorin, toluhydroquinone, tyrosylarginine, xanthosine, acetamidine, trifluoroethanol, trichloroethanol, pyridine-4-aldehyde, hypoxanthine, uric acid, pyrrolidine, diethylamine, piperidine, 3-amino-3-methylpentane, diisopropylamine, saccharin, 2,2,4-trimethylpiperidine, dibutylamine, L-3,4-dihydroxyphenylalanine, 2,2,6,6-tetramethylpiperidine, 5-hydroxytryptamine, butylcyclohexylamine, 2-phenylbenzimidazole, 2-methyl-2-butanethiol, 2-methyl-2-propanethiol, dihexylamine, methoxypyridine, 1,4-dihydroxy-2,3,5,6-tetramethylbenzene, glutarimide, malanonitrile, benzamidine, 4-hydroxyquinoline, 4,4,9,9-tetramethyl-5,8-diazodcdecane-2,11-diamine, 1,6-hexanediamine, 1,7-heptanediamine, 1,8-octanediamine, 1,9-nonanediamine 1,10-decanediamine, 1,12-dodecanediamine, hydrogen hyponitrite, hydroxylamine-N, N-disulfonic acid, (1,2-cyclohexylenedinitrilo)tetraacetic aoid (CyDTA), diethylenetriaminepenta (methylenephosphonic acid) (DETPA), lysine, tyrosine, 3-amino-N,N-bis(2-aminoethyl)propylamine, tris(2-aminoethyl)amine, 3-(cyclohexylamino)-1-propanesulfonic acid, methylamine, dimethylamine, ethylamine, cysteamine, 1,2-ethanediamine, α-alanine, β-alanine, azetidine, methylglycine, cysteine, propylamine, 1,3-propanediamine, 4-aminobutanoic acid, 2-methylalanine, homocysteine, 2,4-diaminobutanoic acid, butylamine, 1,4-butanediamine, 2,3-butanediamine, 1,2-dimethylaminoethane, proline, N-methylpyrrolidine, 5-aminopentanoic acid, N-propylglycine, ornithine, 1-amino-2,2-dimethylpropane, diethylmethylamine, 3-methyl-1-butanamine, 2-methyl-2-butanamine, 3-pentanamine, pentylamine, 1,5-pentanediamine, 2-pyridinecarboxaldehyde oxime, hydroquinone, pipecolic acid, cyclohexylamine, 1,2-dimethylpyrrolidine, 1-methylpiperidine, 6-aminohexanoic acid, hexylamine, triethylamine, cresol, 2-dimethylaminopurine, 1,2-dimethylpiperidine, 1-ethylpiperidine, 2-heptanamine, heptylamine, tyramine, dopamine, N-methyl-2-heptanamine, octylamine, 1-butylpiperidine, nonylamine, tryptamine, d-ephedrine, bornylamine, neobornylamine, decylamine, undecylamine, dodecylamine, tridecylamine, tetradecylamine, L-thyroxine, pentadecylamine, hexadecylamine, octadecylamine, 4-aminobutyric acid, 2-amino-2-methylpropionic acid, 3-aminopropionic acid, ethylenediaminetetraacetic acid (EDTA), N,N'-dimethylethyleneamine-N,N'-diacetic acid, methylaminodiacetic acid, 2-methyl-2-propylamine, nitrilotriacetic acid, 1,2,4-triazole, chloral, ethtyl acetoacetate, phenol, β-phenylethylboric acid, nitromethane, thioglycollic acid, ethyl mercaptan, cyanamide, docosylamine, tert-butylamine, trimethylamine, 2-mercaptoethylamine, 5-aminovaleric acid, 4-aminophenol, hydrogen hypoiodite, aminopropylmorpholine, ethanethiol, carbonic acid, tetramethylammonium carbonate, ammonium bicarbonate, ammonium carbonate, choline bicarbonate, carbon dioxide+water, threonine, hydrogen thiophosphate, sarcosine, 4-methoxyphenol, 4-ethoxyphenol, 4-propoxyphenol, 4-butoxyphenol, 4-pentoxyphenol, 5-hydroxymethylcytosine, oxaloacetic acid, cumene hydroperoxide, diguanidine, hydrogen sulfide and hydrogen peroxophosphate.

25. A composition for stripping or cleaning integrated circuit substrates, comprising:
  (a) one or more metal ion-free bases present in the composition in an amount sufficient to produce a pH of the composition of from about 11 to 13;
  (b) from about 0.1 to about 50% by weight of the composition of at least one bath stabilizing agent comprising at least one compound with at least one pKa in the range of 10 to 13; and
  (c) water;
  (d) with the proviso that when the semiconductor wafer substrate has aluminum or aluminum alloy present the composition also contains from about 0.01% to about 5% by weight of the composition of a water-soluble metal ion-free silicate.

26. A method for cleaning semiconductor wafer substrates having copper, aluminum or alloys thereof, comprising:
  contacting a semiconductor wafer substrate having a substrate surface for a time and at a temperature sufficient to clean unwanted contaminants and residues from said substrate surface with a composition comprising:
    (a) one or more metal ion-free bases in an amount sufficient to produce a pH of the composition of about 11 or greater;
    (b) a bath stabilizing effective amount of at least one bath stabilizing agent comprising at least one compound with at least one pKa in the range of 10 to 13;
    (c) water; and
    (d) from about 0.01% to about 5% by weight of the composition of a water-soluble metal ion-free silicate.

27. The method of claim 26 wherein the semiconductor wafer substrate is in contact with the composition for from about 1 to about 30 minutes.

28. The method of claim 26 wherein the semiconductor wafer substrate is in contact with the composition at a temperature of from about 10° C. to about 85° C.

29. The method of claim 26 further comprising a rinsing and a drying step.

30. The method of claim 26 wherein the composition contains metal ion-free bases in sufficient amounts to produce a pH of from about 10 to about 13.

31. The method of claim 26 wherein the at least one bath stabilizing agent comprises at least one compound with at least one pKa in the range of 11 to 12.5.

32. The method of claim 26 wherein the at least one bath stabilizing agent is selected from the group consisting of acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,6-hexanediamine, 1,8-octanediamine, 1,12-dodecanediamine, 1,3-diaminopentane and orcinol.

33. The method of claim 26 wherein the at least one bath stabilizing agent is added to a concentration of from 0.1 to 50% by weight.

34. The method of claim 26 wherein the at least one bath stabilizing agent is selected from the group consisting of 2-hydroxypyridine, 4-hydroxypyridine, resorcinol and 2-methylresorcinol.

35. The method of claim 26 wherein the composition further contains one or more chelating or complexing agents in the composition and wherein the concentration of chelating or complexing agents is from about 0.01% to about 10% by weight.

36. The method according to claim 35 wherein the bath stabilizing agent is hydrogen peroxide and the chelating or complexing agent is selected from the group consisting of (1,2-cyclohexylenedinitrilo)tetraacetic acid (CyDTA) and phosphonic acids.

37. The method of the claim 35 wherein the chelating or complexing agent is selected from the group consisting of aminocarboxylic acids and phosphonic acids.

38. The method of claim 35 wherein the chelating agent is selected from the group consisting of (ethylenedinitrilo)tetraacetic acid, diethylenetriaminepentaacetic acid, triethylenetraminehexaacetic acid, 1,3-diamino-2-hydroxypropane-N,N,N',N'-tetraacetic acid, N,N',N'-ethylenediaminetetra(methylenephosphonic acid), cis-(1,2-cyclohexylenedinitrilo)tetraacetic acid, 1,5,9-triazacyolododecane-N,N',N"-tris(methylenephosphonic acid) (DOTRP), 1,4,7,10-tetraazacyclododecane-N,N',N",N'"-tetrakis (methylenephosphonic acid) (DOTP), nitrilotris (methylene)triphosphonic acid, diethylenetriaminepenta (methylenephosphonic acid), aminotri (methylenephosphonic acid), 1-hydroxyethylene-1,1-diphosphonic acid, bis(hexamethylene)triamine phosphonic acid, 1,4,7-triazacyclononane-N,N',N"-tris (methylenephosphonic acid) (NOTP), ethylenediaminetetraa(methylenephosphonic acid), 2-phosphonobutane-1,2,4-tricarboxylic acid, and trans-(1,2-cyclohexylenedinitrilo)tetraacetic acid.

39. The method of claim 26 wherein the composition further contains one or more water-soluble organic co-solvents in the composition.

40. The method of claim 39 wherein the concentration of water-soluble organic co-solvents is from about 0.1% to about 30% by weight.

41. The method of claim 39 wherein said water-soluble organic co-solvent is selected from the group consisting of 1-hydroxyalkyl-2-pyrrolidinones, alcohols and polyhydroxy compounds.

42. The method of claim 39 wherein said water-soluble organic co-solvent is glycerol.

43. The method of claim 26 wherein the composition further contains one or more water-soluble surfactants in the composition.

44. The method of claim 43 further wherein the concentration of water-soluble surfactants is from about 0.01% to about 1% by weight.

45. The method of claim 26 wherein the base in the composition is selected from the group consisting of hydroxides and organic amines.

46. The method of claim 45 wherein the base in the composition is selected from the group consisting of quaternary ammonium hydroxides, ammonium hydroxides, and organic amines.

47. The method of claim 26 wherein the base in the composition is selected from the group consisting of choline, tetrabutylammonium hydroxide, tetramethylammonium hydroxide, monomethyltriethanolammonium hydroxide, monomethyltriethylammonium hydroxide, tetraethylammonium hydroxide, tetrapropylammonium hydroxide, tetraethanolammonium hydroxide, 2-methyl-1,5-pentanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine, 1,12-dodecanediamine and 1,3-diaminopentane.

48. The method of claim 26 wherein the water-soluble metal ion-free silicate in the composition is selected from the group consisting of ammonium silicates and quaternary ammonium silicates.

49. The method of claim 26 wherein the water-soluble metal ion-free silicate in the composition is tetramethylammonium silicate.

50. The method of claim 26 wherein the composition contains from about 0.1–25% by weight tetramethylammonium hydroxide and about 0.01–1% by weight of tetramethylammonium silicate.

51. The method of claim 50 wherein the composition further contains 0.01–1% by weight of a chelating or complexing agent selected from the group consisting of (1,2-cyclohexylenedinitrilo)tetraacetic acid or a phosphonic acid.

52. The method of claim 26 wherein the bath stabilizing agent is selected from the group consisting of acetone oxime, hydrogen peroxide, salicylic acid, 5-acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine, 1,12-dodecanediamine, 1,3-diaminopentane, orcinol, hydrogen germanate, adenosine, cytosine, arginine, benzil-α-dioxime, benzimidazole, banzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, dimethylbiguanide, diguanide, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, 4-formyl-3-methoxypyridine, guanine, guanosine, 2-hydroxybenzaldehyde oxime, N-(hydroxyethyl) biguanide, 2-hydroxyquinoline, hypoxanthene, inosine, 5-iodohistamine, 2,2'-methylenebis(4-chlorophenol), 2-methyl-8-hydroxyquinoline, 4-methyl-8-hydroxyquinoline, 1-methylxanthine, phenylalanylarginine, silicic acid, sparteine, thorin, toluhydroquinone, tyrosylarginine, xanthosine, acetamidine, trifluoroethanol, trichloroethanol, pyridine-4-aldehyde, hypoxanthine, uric acid, pyrrolidine, diethylamine, piperidine, 3-amino-3-methylpentane, diisopropylamine, saccharin, 2,2,4-trimethylpiperidine, dibutylamine, L-3,4-dihydroxyphenylalanine, 2,2,6,6-tetramethylpiperidine, 5-hydroxytryptamine, butylcyclohexylamine, 2-phenylbenzimidazole, 2-methyl-2-butanethiol, 2-methyl- 2-propanethiol, dihexylamine, methoxypyridine, 1,4-dihydroxy-2,3,5,6-tetramethylbenzene, glutarimide, malanonitrile, benzamidine, 4-hydroxyquinoline, 4,4,9,9-tetramethyl-5,8-diazododecane-2,11-dismine, 1,6-hexanediamine, 1,7-heptanediamine, 1,8-octanediamine, 1,9-nonanediamine 1,10-decanediamine, 1,12-dodecanediamine, hydrogen hyponitrite, hydroxylamine-N,N-disulfonic acid, (1,2-cyclohexylenedinitrilo)tetraacetic acid (CyDTA), diethylenetriaminepenta (methylenephosphonic acid) (DETPA), lysine, tyrosine, 3-amino-N,N-bis(2-aminoethyl)propylamine)tris(2-aminoethyl)amine, 3-(cyclohexylamino)-1-propanesulfonic acid, methylamine, dimethylamine, ethylamine, cysteamine, 1,2-ethanediamine, α-alanine, β-alanine, azetidine, methylglycine, cysteine, propylamine, 1,3-propanediamine, 4-aminobutanoic acid, 2-methylalanine, homocysteine, 2,4-diaminobutanoic acid, butylamine, 1,4-butanediamine, 2,3-butanediamine, 1,2-dimethylaminoethane, proline, N-methylpyrrolidine, 5-aminopentanoic acid, N-propylglycine, ornithine, 1-amino-2,2-dimethylpropane, diethylmethylamine, 3-methyl-1-butanamine, 2-methyl-2-butanamine, 3-pentanamine, pentylamine, 1,5-pentanediamine, 2-pyridinecarboxaldehyde oxime, hydroquinone, pipecolic acid, cyclohexylamine, 1,2-dimethylpyrrolidine, 1-methylpiperidine, 6-aminohexanoic acid, hexylamine, triethylamine, cresol, 2-dimethylaminopurine, 1,2-dimethylpiperidine, 1-ethylpiperidine, 2-heptanamine, heptylamine, tyramine, dopamine, N-methyl-2-heptanamine, octylamine, 1-butylpiperidine, nonylamine, tryptamine, d-ephedrine, bornylamine, neobomylamine, decylamine, undecylamine, dodecylamine, tridecylamine, tetradecylamine, L-thyroxine, pentadecylamine, hexadecylamine, octadecylamine, 4-aminobutyric acid, 2-amino-2-methylpropionic acid, 3-aminopropionic acid, ethylenediaminetetreacetic acid (EDTA), N,N'-dimethylethyleneamine-N,N'-diacetic acid, methylaminodiacetic acid, 2-methyl-2-propylamine, nitrilotriacetic acid, 1,2,4-triazole, chloral, ethtyl acetoacetate, phenol, β-phenylethyboric acid, nitromethane, thioglycollic acid, ethyl mercaptan, cyanamide, docosylamine, tert-butylamine, trimethylamine, 2-mercaptoethylamine, 5-aminovaleric acid, 4-aminophenol, hydrogen hypoiodite, aminopropylmorpholine, ethanethiol, carbonic acid, tetramethylammonium carbonate, ammonium bicarbonate, ammonium carbonate, choline bicarbonate, carbon dioxide+water, threonine, hydrogen thiophosphate, sarcosine, 4-methoxyphenol, 4-ethoxyphenol, 4-propoxyphenol, 4-butoxyphenol, 4-pentoxyphenol, 5-hydroxymethylcytosine, oxaloacetic acid, cumene hydroperoxide, diguanidine, hydrogen sulfide and hydrogen peroxophosphate.

53. A method for cleaning semiconductor wafer substrates, comprising:
   contacting a semiconductor wafer substrate having a substrate surface for a time and at a temperature sufficient to clean unwanted contaminants and residues from said substrate surface with a composition comprising:
   (a) one or more metal ion-free bases present in the composition in an amount to provide a pH of the composition of from about 11 to 13;
   (b) at least one bath stabilizing agent comprising at least one compound with at least one pKa in the range of 10 to 13, with the one or more bath stabilizing agent present in the composition in an amount of from about 0.1 to about 50% by weight of the composition; and
   (c) water.

54. The method of claim 52 wherein said at least one bath stabilizing agent is added to a concentration of from 0.1 to 50% by weight of the composition.

55. The method of claim 52 wherein said at least one bath stabilizing agent is selected from the group consisting of 2-hydroxypyridine, 4-hydroxypyridine, resorcinol and 2-methyl resorcinol.

56. The method of claim 54 wherein said at least one bath stabilizing agent is added to a concentration of from 0.1 to 35% by weight of the composition.

57. A method of extending bath-life of an aqueous alkaline composition for stripping or cleaning integrated circuit substrates wherein said composition comprises:
   (a) one or more metal ion-free bases in an amount sufficient to produce a pH of the composition of about 11 or greater;
   (b) water; and
   (c) from about 0.01% to about 5% by weight of the composition of a water-soluble metal ion-free silicate;
   said method comprising adding to said composition a bath stabilizing effective amount of at least one bath stabilizing agent comprising at least one compound having at least one pKa in the range of 10 to 13.

58. The method of claim 57 wherein said at least one bath stabilizing agent comprises a compound with at least one pKa in the range of 11 to 12.5.

59. The method of claim 57 wherein said at least one bath stabilizing agent is selected from the group consisting of acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,6-hexanediamine, 1,8-octanediamine, 1,12-dodecanediamine, 1,3-diaminopentane and orcinol.

60. The method according to claim 57 wherein the bath stabilizing agent is selected from the group consisting of acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine, 1,12-dodecanediamine, 1,3-diaminopentane, orcinol, hydrogen germanate, adenosine, cytosine, arginine, benzil-α-dioxime, benzimidazole, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyolohexylenedinitriloacetic, cytidine, diethylbiguanide, diguanide, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, 4-formyl-3-methoxypyridine, guanine, guanosine, 2-hydroxybenzaldehyde oxime, N-(hydroxyethyl) biguanide, 2-hydroxyquinoline, hypoxanthene, inosine, 5-iodohistamine, 2,2'-methylenebis(4-chrorophenol), 2-methyl-8-hydroxyquinoline, 4-methyl-8-hydroxyquinoline, 1-methylxanthine, phenylalanylarginine, silicic acid, sparteine, thorin, toluhydroquinone, tyrosylarginine, xanthosine, acetamidine, trifluoroethanol, trichloroethanol, pyridine-4-aldehyde, hypoxanthine, uric acid, pyrrolidine, diethylamine, piperidine, 3-amino-3-methylpentane, diisopropylamine, saccharin, 2,2,4- trimethylpiperidine, dibutylamine, L-3,4-dihydroxyphenylalanine, 2,2,6,6-tetramethylpiperidine, 5-hydroxytryptamine, butylcyclohexylamine, 2-phenylbenzimidazole, 2-methyl-2-butanethiol, 2-methyl-2-propanethiol, dihexylamine, methoxypyridine, 1,4-dihydroxy-2,3,5,6-tetramethylbenzene, glutarimide, malanonitrile, benzamidine, 4-hydroxyquinoline, 4,4,9,9-tetramethyl-5,8-diazododecane-2,11-diamine, 1,6-hexanediamine, 1,7-heptanediamine, 1,8-octanediamine, 1,9-nonanediamine, 1,10-decanediamine, 1,12-dodecanediamine, hydrogen hyponitrite, hydroxylamine-N,N-disulfonic acid, (1,2-cyclohexylenedinitrilo)tetraacetic acid (CyDTA), diethylenetriaminepenta (methylenephosphonic acid) (DETPA), lysine, tyrosine, 3-amino-N,N-bis(2-aminoethyl)propylamine, tris(2-aminoethyl)amine, 3-(cyclohexylamino)-1-propanesulfonic acid, methylamine, dimethylamine, ethylamine, cysteamine, 1,2-ethanediamine, α-alanine, β-alanine, azetidine, methylglycine, cysteine, propylamine, 1,3-propanediamine, 4-aminobutanoic acid, 2-methylalanine, homocysteine, 2,4-diaminobutanoic , butylamine, 1,4-butanediamine, 2,3-butanediamine, 1,2-dimethylaminoethane, proline, N-methylpyrrolidine, 5-aminopentanoic acid, N-propylglycine, ornithine, 1-amino-2,2-dimethylpropane, diethylmethylamine, 3-methyl-1-butanamine, 2-methyl-2-butanamine, 3-pentanamine, pentylamine, 1,5-pentanediamine, 2-pyridinecarboxaldehyde oxime, hydroquinone, pipecolic acid, cyclohexylamine, 1,2-dimethylpyrrolidine, 1-methylpiperidine, 6-aminohexanoic acid, hexylamine, triethylamine, cresol, 2-dimethylaminopurine, 1,2-dimethylpiperidine, 1-ethylpiperidine, 2-heptanamine, heptylamine, tyramine, dopamine, N-methyl-2-heptanamine, octylamine, 1-butylpiperidine, nonylamine, tryptamine, d-ephedrine, bornylamine, neobornylamine, decylamine, undecylamine, dodecylamine, tridecylamine, tetradecylamine, L-thyroxine, pentadecylamine, hexadecylamine, octadecylamine, 4-aminobutyric acid, 2-amino-2-methylpropionic acid, 3-aminopropionic acid, ethylenediaminetetraacetic acid (EDTA), N,N'-dimethylethyleneamine-N,N'-diacetic acid, methylaminodiacetic acid, 2-methyl-2-propylamine, nitrilotriacetic acid, 1,2,4-triazole, chloral, ethtyl acetoacetate, phenol, β-phenylethylboric acid, nitromethane, thioglycoilic acid, ethyl mercaptan, cyanamide, docosylamine, tert-butylamine, trimethylamine, 2-mercaptoethylamine, 5-aminovaleric acid, 4-aminophenol, hydrogen hypoiodite, aminopropylmorpholine, ethanethiol, carbonic acid, tetramethylammonium carbonate, ammonium bicarbonate, ammonium carbonate, choline bicarbonate, carbon dioxide+water, threonine, hydrogen thiophosphate, sarcosine, 4-methoxyphenol, 4-ethoxyphenol, 4-propoxyphenol, 4-butoxyphenol, 4-pentoxyphenol, 5-hydroxymethylcytosine, oxaloacetic acid, cumene hydroperoxide, diguanidine, hydrogen sulfide and hydrogen peroxophosphate.

\* \* \* \* \*